United States Patent
Lazo Martinez et al.

(10) Patent No.: US 11,774,796 B1
(45) Date of Patent: Oct. 3, 2023

(54) DISPLAY DEVICE AND METHOD OF MANUFACTURING THE SAME

(71) Applicant: Samsung Display Co., LTD., Yongin-si (KR)

(72) Inventors: Israel Esteban Lazo Martinez, Yongin-si (KR); Suk Hoon Kang, Yongin-si (KR); Yi Seop Shim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/085,651

(22) Filed: Dec. 21, 2022

(30) Foreign Application Priority Data

Apr. 20, 2022 (KR) .................. 10-2022-0049122

(51) Int. Cl.
| | |
|---|---|
| *G02F 1/13357* | (2006.01) |
| *G02F 1/1335* | (2006.01) |
| *H01L 25/16* | (2023.01) |
| *H01L 33/50* | (2010.01) |
| *H01L 33/58* | (2010.01) |
| *G02F 1/1343* | (2006.01) |

(52) U.S. Cl.
CPC ...... *G02F 1/1336* (2013.01); *G02F 1/133504* (2013.01); *G02F 1/133514* (2013.01); *G02F 1/134309* (2013.01); *H01L 25/167* (2013.01); *H01L 33/502* (2013.01); *H01L 33/58* (2013.01); *H01L 2933/0041* (2013.01)

(58) Field of Classification Search
CPC ............. G02F 1/1336; G02F 1/133504; G02F 1/133514; G02F 1/134309; H01L 25/167; H01L 33/502; H01L 33/58; H01L 2933/0041
See application file for complete search history.

(56) References Cited

FOREIGN PATENT DOCUMENTS

WO WO-2016133308 A1 * 8/2016 ........... C09K 19/544

OTHER PUBLICATIONS

Machine translation of WO-2016133308-A1 (Year: 2016).*
Yi-Hsin Lin et al., "A polarizer-free flexible and reflective electrooptical switch using dye-doped liquid crystal gels", Optics Express, Jan. 25, 2008, pp. 1777-1785, vol. 16, No. 3.
Seok-Gon Hwang et al., "Homeotropic alignment behavior of liquid crystal molecules on self-assembled monolayers with fluorinated alkyl chain", Journal of Vacuum Science & Technology A, Jun. 13, 2018, vol. 36, No. 4.
Danqing Liu et al., "Liquid Crystal Polymer Networks: Preparation, Properties, and Applications of Films with Patterned Molecular Alignment", Langmuir, Apr. 7, 2014, pp. 13499-13509, vol. 30, No. 45.
Joon Heo et al., "Fast-switching initially-transparent liquid crystal light shutter with crossed patterned electrodes", AIP Advances, Apr. 28, 2015, pp. 1-7, vol. 5, No. 4.

* cited by examiner

*Primary Examiner* — Anne M Hines
*Assistant Examiner* — Jose M Diaz
(74) *Attorney, Agent, or Firm* — KILE PARK REED & HOUTTEMAN PLLC

(57) ABSTRACT

The display device includes electrodes disposed in pixels, the electrodes being spaced apart from each other, light emitting elements disposed between the electrodes, a bank including opening overlapping the light emitting elements, and a color conversion layer disposed in the opening. The bank includes a polymer and a liquid crystal material.

20 Claims, 20 Drawing Sheets

DISPLAY DEVICE AND METHOD OF MANUFACTURING THE SAME

CROSS-REFERENCE TO RELATED APPLICATION(S)

This application claims priority to and benefits of Korean patent application No. 10-2022-0049122 under 35 U.S.C. § 119, filed on Apr. 20, 2022, in the Korean Intellectual Property Office (KIPO), the entire contents of which are incorporated herein by reference.

BACKGROUND

1. Technical Field

Embodiments relate to a display device and a method of manufacturing the display device.

2. Description of the Related Art

Recently, as interest in information displays is increased, research and development of display devices have been continuously conducted.

SUMMARY

Embodiments provide a display device capable of improving the efficiency of a color conversion layer.

Embodiments provide a method of manufacturing the display device and capable of stable forming a bank.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include electrodes disposed in pixels, the electrodes being spaced apart from each other, light emitting elements disposed between the electrodes, a bank including opening overlapping the light emitting elements, and a color conversion layer disposed in the opening, wherein the bank may include a polymer and a liquid crystal material.

A refractive index of the polymer and an ordinary refractive index of the liquid crystal material may be substantially equal to each other.

A refractive index of the polymer and an extraordinary refractive index of the liquid crystal material may be different from each other.

A difference between an extraordinary refractive index and an ordinary refractive index of the liquid crystal material may be about 0.2 or more.

The bank may further include a color developing member dispersed in the polymer.

An orientation direction of the color developing member in the polymer and an orientation direction of the liquid crystal material may be same as each other.

The pixels may include a first pixel, a second pixel, and a third pixel. The bank may be disposed at a boundary area of the first pixel, the second pixel, and the third pixel.

The color conversion layer may include a first color conversion layer overlapping the first pixel, a second color conversion layer overlapping the second pixel, and a light scattering layer overlapping the third pixel.

The display device may further include a color filter layer disposed above the color conversion layer.

The color filter layer may include a first color filter layer disposed above the first color conversion layer, a second color filter layer disposed above the second color conversion layer, and a third color filter layer disposed above the light scattering layer.

The display device may further include connection electrodes disposed on the light emitting elements.

Each of the light emitting elements includes a first semiconductor layer, a second semiconductor layer disposed on the first semiconductor layer, and an active layer disposed between the first semiconductor layer and the second semiconductor layer.

In an embodiment, a method of manufacturing a display device may include providing light emitting elements on a substrate, forming, on the light emitting elements, a bank including a polymer and a liquid crystal material, forming an opening by etching the bank, and forming a color conversion layer in the opening.

The forming of the bank may include forming a bank material layer including the liquid crystal material, a monomer, and a binder, and curing the bank material layer.

The bank material layer may further include a color developing member.

A refractive index of the polymer and an ordinary refractive index of the liquid crystal material may be substantially equal to each other.

A refractive index of the polymer and an extraordinary refractive index of the liquid crystal material may be different from each other.

A difference between an extraordinary refractive index and an ordinary refractive index of the liquid crystal material may be about 0.2 or more.

The method may further include forming electrodes spaced apart from each other on the substrate.

The method may further include aligning the light emitting elements between the electrodes.

The method may further include forming a color filter layer over the color conversion layer.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
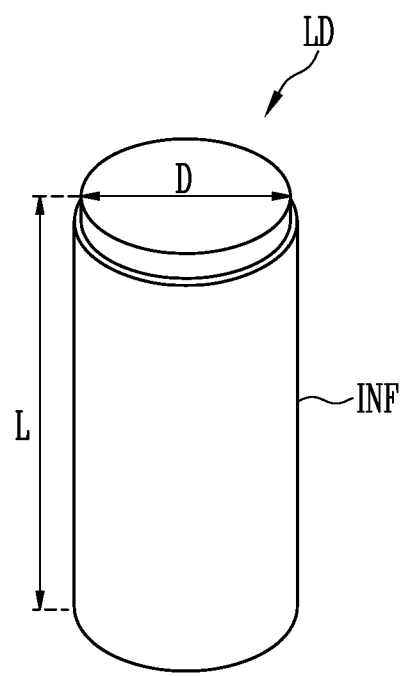
FIG. 1 is a schematic perspective view illustrating a light emitting element in accordance with an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

The terminology used herein is for the purpose of describing embodiments only and is not construed as limiting the inventive concept. As used herein, the singular forms are intended to include the plural forms as well, unless the context clearly indicates otherwise. The terms "comprises/includes" and/or "comprising/including," in case that used in the disclosure, specify the presence of mentioned component, step, operation and/or element, but do not exclude the presence or addition of one or more other components, steps, operations and/or elements.

In case that described as that any element is "connected", "coupled" or "accessed" to another element, it should be understood that it is possible that still another element is "connected", "coupled" or "accessed" between the two elements as well as that the two elements are directly "connected", "coupled" or "accessed" to each other.

The term "on" that is used to designate that an element or layer is on another element or layer includes both a case where an element or layer is positioned directly on another element or layer, and a case where an element or layer is positioned on another element or layer via still another element layer. Like reference numerals generally denote like elements throughout the disclosure.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, embodiments will be described in more detail with reference to the accompanying drawings.

Figure 2:
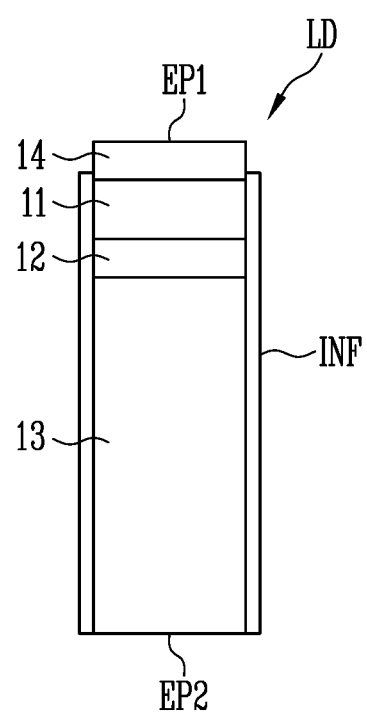
FIG. 2 is a schematic sectional view illustrating the light emitting element of FIG. 1.

FIG. 1 is a schematic perspective view illustrating a light emitting element in accordance with an embodiment. FIG. 2 is a schematic sectional view illustrating the light emitting element FIG. 1. Although a pillar-shaped light emitting element LD is illustrated in FIGS. 1 and 2, the kind and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a pillar shape extending along one direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

In some embodiments, the light emitting element LD may be a light emitting element manufactured in a pillar shape by an etching process, etc. In the disclosure, the term "pillar shape" may include a rod-like shape or bar-like shape, of which aspect ratio is greater than 1, such as a cylinder or a polyprism, and the shape of its section is not limited thereto.

The light emitting element LD may have a size in a range of nanometer scale to micrometer scale. In an example, the light emitting element LD may have a diameter D (or width) in a range of nanometer scale to micrometer scale and/or a length L in a range of nanometer scale to micrometer scale. However, the size of the light emitting element LD is not limited thereto, and the size of the light emitting element LD may be variously changed according to design conditions of various types of devices, e.g., a display device, and the like, which use, as a light source, a light emitting device using the light emitting element LD.

The first semiconductor layer 11 may be a first conductivity type semiconductor layer. For example, the first semiconductor layer 11 may include a p-type semiconductor layer. In an example, the first semiconductor layer 11 may include at least one semiconductor material among InAlGaN, GaN, AlGaN, InGaN, AlN, and InN, and include a p-type semiconductor layer doped with a first conductivity type dopant such as Mg. However, the material constituting the first semiconductor layer 11 is not limited thereto. For example, the first semiconductor layer 11 may be formed of various materials.

The active layer 12 may be disposed between the first semiconductor layer 11 and the second semiconductor layer 13. The active layer 12 may include any one structure among a single well structure, a multi-well structure, a single quantum well structure, a multi-quantum well (MQW) structure, a quantum dot structure, and a quantum wire structure, but embodiments are not limited thereto. The active layer 12 may include GaN, InGaN, InAlGaN, AlGaN, AlN, or the like. For example, the active layer 12 may be formed of various materials.

In case that a voltage which is a threshold voltage or more is applied to ends (e.g., opposite ends) of the light emitting element LD, the light emitting element LD may emit light as electron-hole pairs are combined in the active layer 12. The light emission of the light emitting element LD may be controlled according to such a principle, so that the light emitting element LD may be used as a light source for various light emitting devices, including a pixel of a display device.

The second semiconductor layer 13 may be formed on the active layer 12, and may include a semiconductor layer having a type different from that of the first semiconductor layer 11. For example, the second semiconductor layer 13 may include an n-type semiconductor layer. In an example, the second semiconductor layer 13 may include any one semiconductor material among InAlGaN, GaN, AlGaN, InGaN, AlN, and InN, and include an n-type semiconductor layer doped with a second conductivity type dopant such as Si, Ge or Sn. However, the material constituting the second semiconductor layer 13 is not limited thereto. For example, the second semiconductor layer 13 may be formed of various materials.

The electrode layer 14 may be disposed on the first end portion EP1 and/or the second end portion EP2 of the light emitting element LD. Although a case where the electrode layer 14 is formed on the first semiconductor layer 11 is illustrated as an example in FIG. 2, embodiments are not limited thereto. For example, a separate electrode layer may be further disposed on the second semiconductor layer 13.

The electrode layer 14 may include a transparent metal or a transparent metal oxide. In an example, the electrode layer 14 may include at least one of indium tin oxide (ITO), indium zinc oxide (IZO), zinc oxide (ZnO), and zinc tin oxide (ZTO), but embodiments are not limited thereto. In case that the electrode layer 14 may be made of a transparent metal or a transparent metal oxide, light generated in the active layer 12 of the light emitting element LD may pass through the electrode layer 14 and be emitted to the outside of the light emitting element LD.

An insulative film INF may be disposed on a surface of the light emitting element LD. The insulative film INF may be disposed directly on surfaces of the first semiconductor layer 11, the active layer 12, the second semiconductor layer 13, and/or the electrode layer 14. The insulative film INF may expose the first and second end portions EP1 and EP2 of the light emitting element LD, which have different polarities. In some embodiments, the insulative film INF may expose a side portion of the electrode layer 14 and/or the second semiconductor layer 13, adjacent to the first and second end portions EP1 and EP2 of the light emitting element LD.

The insulative film INF may prevent an electrical short circuit which may occur in case that the active layer 12 is in contact with a conductive material except the first and second semiconductor layers 11 and 13. Also, the insulative film INF may minimize a surface defect of light emitting elements LD, thereby the lifetime and light emission efficiency of the light emitting elements LD.

The insulative film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulative film INF may be formed as a double layer, and layers constituting the double layer may include different materials. In an example, the insulative film INF may be formed as a double layer including aluminum oxide ($ALO_x$) and silicon oxide ($SiO_x$), but embodiments are not limited thereto. In some embodiments, the insulative film INF may be omitted.

A light emitting device including the above-described light emitting element LD may be used in various kinds of devices which require a light source, including a display device. For example, light emitting elements LD may be disposed in each pixel of a display panel, and be used as a light source of each pixel. However, the application field of the light emitting element LD is not limited to the above-described example. For example, the light emitting element LD may be used in other types of devices that require a light source, such as a lighting device.

Figure 3:
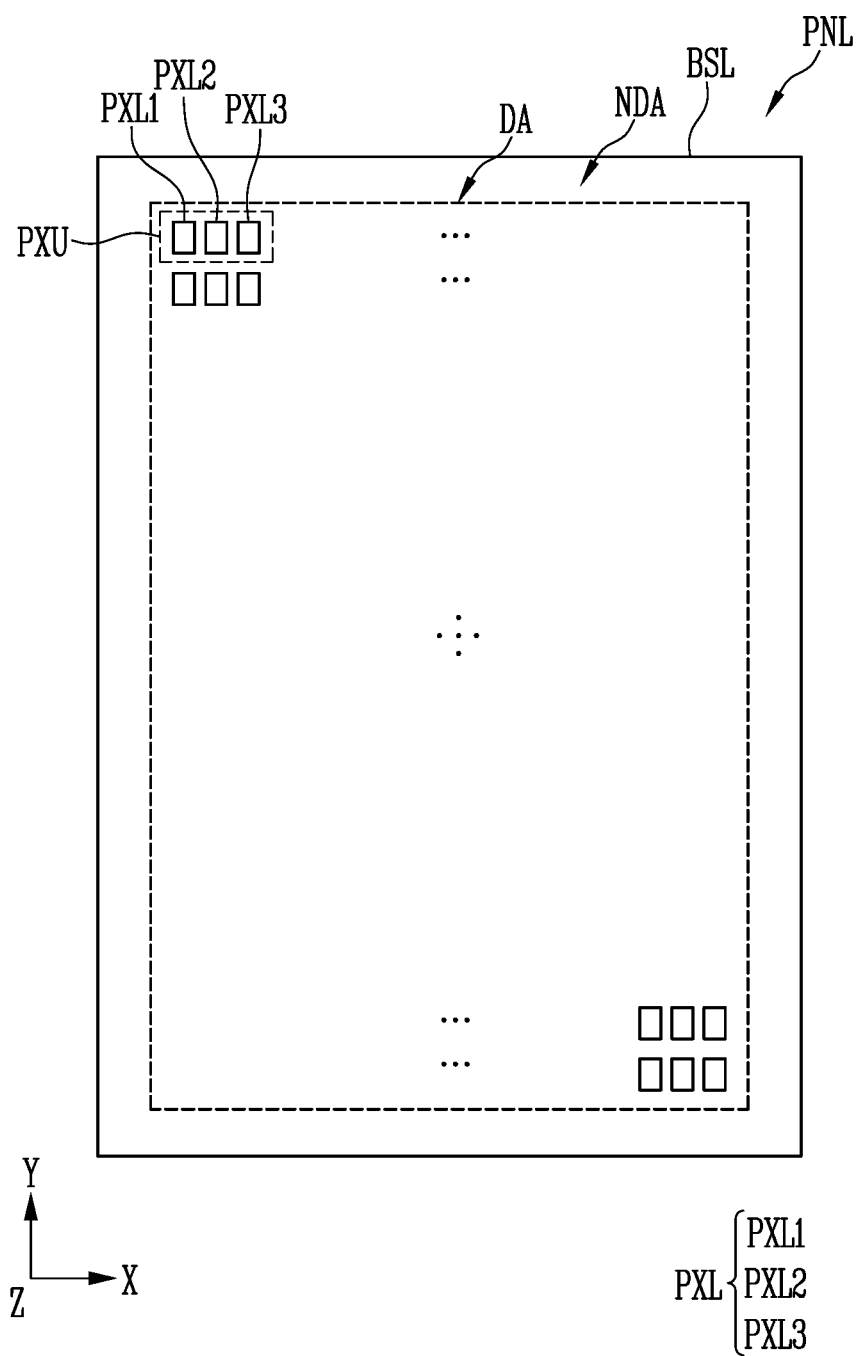
FIG. 3 is a schematic plan view illustrating a display device in accordance with an embodiment.

FIG. 3 is a schematic plan view illustrating a display device in accordance with an embodiment.

In FIG. 3, a display device, e.g., a display panel PNL included in the display device will be illustrated as an example of an electronic device which may use, as a light source, the light emitting element LD described in the embodiment shown in FIGS. 1 and 2.

For convenience of description, in FIG. 3, a structure of the display panel PNL will be illustrated based on a display area DA. However, in some embodiments, at least one driving circuit (e.g., at least one of a scan driver and a data driver), lines, and/or pads may be further disposed in the display panel PNL.

Referring to FIG. 3, the display panel PNL and a base layer BSL may include the display area DA for displaying an image and a non-display area NDA except the display area DA. The display area may constitute a screen on which the image is displayed, and the non-display area NDA may be the other area except the display area DA.

A pixel unit PXU may be disposed in the display area DA. The pixel unit PXU may include a first pixel PXL1, a second pixel PXL2, and/or a third pixel PXL3. Hereinafter, in case that at least one pixel among the first pixel PXL1, the second pixel PXL2, and the third pixel PXL3 is arbitrarily designated or in case that two or more kinds of pixels among the first pixel PXL1, the second pixel PXL2, and the third pixel PXL3 are inclusively designated, the corresponding pixel or the corresponding pixels will be referred to as a "pixel PXL" or "pixels PXL."

The pixels PXL may be regularly arranged according to a stripe structure, a PENTILE™ structure, or the like. However, the arrangement structure of the pixels PXL is not limited thereto, and the pixels PXL may be arranged in the display area DA by using various structures and/or methods.

In some embodiments, two or more kinds of pixels PXL emitting lights of different colors may be arranged in the display area DA. In an example, first pixels PXL1 emitting light of a first color, second pixels PXL2 emitting light of a second color, and third pixels PXL3 emitting light of a third color may be arranged in the display area DA. At least one first pixel PXL1, a least one second pixel PXL2, and at least one third pixel PXL3, which are disposed adjacent to each other, may constitute a pixel unit (e.g., a single pixel unit) PXU capable of emitting lights of various colors. For example, each of the first to third pixels PXL1, PXL2, and PXL3 may be a pixel emitting light of a specific color. In some embodiments, the first pixel PXL1 may be a red pixel emitting light of red, the second pixel PXL2 may be a green pixel emitting light of green, and the third pixel PXL3 may be a blue pixel emitting light of blue. However, embodiments are not limited thereto.

In an embodiment, the first pixel PXL1, the second pixel PXL2, and the third pixel PXL3 may have light emitting elements emitting light of the same color, and may include color conversion layers and/or color filters of different colors, which are disposed on the respective light emitting elements and may respectively emit lights of the first color, the second color, and the third color. In another example, the first pixel PXL1, the second pixel PXL2, and the third pixel PXL3 respectively may have, as light sources, a light emitting element of the first color, a light emitting element of the second color, and a light emitting element of the third color, so that the light emitting elements may respectively emit lights of the first color, the second color, and the third color. However, the color, kind, and/or number of pixels PXL constituting each pixel unit PXU are not limited thereto. In an example, the color of light emitted by each pixel PXL may be variously changed.

The pixel PXL may include at least one light source driven by a specific control signal (e.g., a scan signal and a data signal) and/or a specific power source (e.g., a first power source and a second power source). In an embodiment, the light source may include at least one light emitting element LD in accordance with the embodiment shown in FIGS. 1 and 2, e.g., a subminiature pillar-shaped light emitting element LD having a size small to a degree of nanometer scale to micrometer scale. However, embodiments are not limited thereto. For example, various types of light emitting elements LD may be used as the light source of the pixel PXL.

In an embodiment, each pixel PXL may be formed as an active pixel. However, the kind, structure, and/or driving method of pixels PXL which may be applied to the display device are not limited thereto. For example, each pixel PXL may be formed as a pixel of a passive or active light emitting display device using various structures and/or driving methods.

Figure 4:
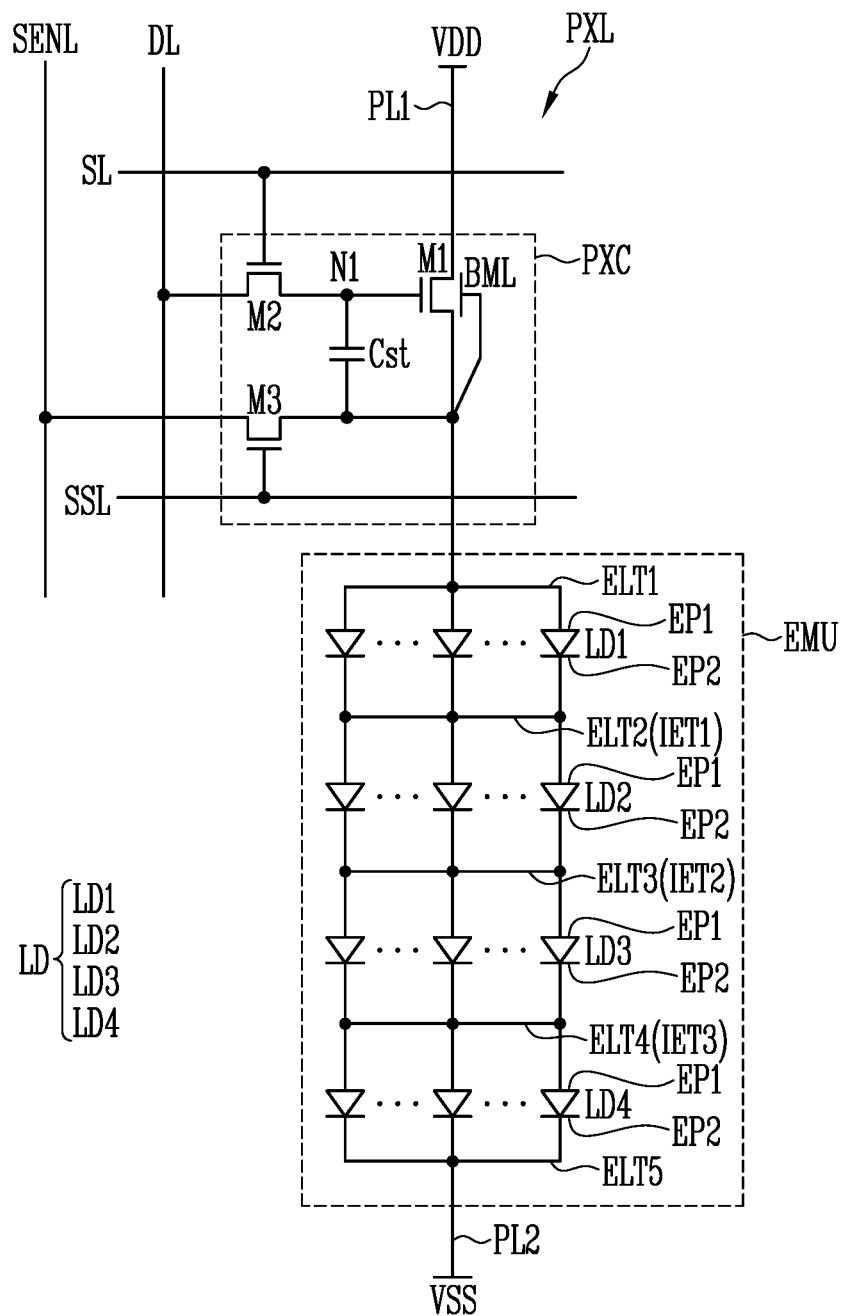
FIG. 4 is a schematic diagram of an equivalent circuit of a pixel in accordance with an embodiment.

FIG. 4 is a schematic diagram of an equivalent circuit of a pixel in accordance with an embodiment.

The pixel PXL shown in FIG. 4 may be any one of the first pixel PXL1, the second pixel PXL2, and the third pixel PXL3, which are included in the display panel PNL shown in FIG. 3. The first pixel PXL1, the second pixel PXL2, and the third pixel PXL3 may have structures substantially identical or similar to one another.

Referring to FIG. 4, the pixel PXL may include a light emitting unit EMU for generating light with a luminance corresponding to a data signal and a pixel circuit PXC for driving the light emitting unit EMU.

The pixel circuit PXC may be connected between a first power source VDD and the light emitting unit EMU. Also, the pixel circuit PXC may be connected to a scan line SL and a data line DL of the corresponding pixel PXL and may control an operation of the light emitting unit EMU according to a scan signal and the data signal, which are supplied from the scan line SL and the data line DL. Also, the pixel circuit PXC may be selectively further connected (e.g., electrically connected) to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and a first connection electrode ELT1. A gate electrode of the first transistor M1 may be connected to a first node N1. The first transistor M1 may control a driving current supplied to the light emitting unit EMU according to a voltage of the first node N1. For example, the first transistor M1 may be a driving transistor for controlling the driving current of the pixel PXL.

In an embodiment, the first transistor M1 may selectively include a lower conductive layer BML (also referred to as a "lower electrode," a "back gate electrode," or a "lower light blocking layer"). The gate electrode of the first transistor M1 and the lower conductive layer BML of the first transistor M1 may overlap each other with an insulating layer interposed therebetween. In an embodiment, the lower conductive layer BML may be connected to an electrode, e.g., a source or drain electrode of the first transistor M1.

In case that the first transistor M1 includes the lower conductive layer BML, there may be applied a back-biasing technique (or sync technique) for moving a threshold voltage of the first transistor M1 in a negative direction or a positive direction by applying a back-biasing voltage to the lower conductive layer BML of the first transistor M1 in driving of the pixel PXL. In an example, a source-sync technique may be applied by connecting the lower conductive layer BML to a source electrode of the first transistor M1, so that the threshold voltage of the first transistor M1 may be moved in the negative direction or positive direction. For example, in case that the lower conductive layer BML is disposed on the bottom of a semiconductor pattern constituting a channel of the first transistor M1, the lower conductive layer BML may function as a light blocking pattern, thereby stabilizing operational characteristics of the first transistor M1. However, the function and/or application method of the lower conductive layer BML is not limited thereto.

The second transistor M2 may be connected between the data line DL and the first node N1. For example, a gate electrode of the second transistor M2 may be connected to the scan line SL. The second transistor M2 may be turned on in case that a scan signal having a gate-on voltage (e.g., a high level voltage) is supplied from the scan line SL and may connect the data line DL and the first node N1 to each other.

A data signal of a corresponding frame may be supplied to the data line DL for each frame period. The data signal may be transferred to the first node N1 through the turned-on second transistor M2 during a period in which the scan signal having the gate-on voltage is supplied. For example, the second transistor M2 may be a switching transistor for transferring each data signal to the inside of the pixel PXL.

An electrode of the storage capacitor Cst may be connected to the first node N1, and the other electrode of the storage capacitor Cst may be connected to a second electrode of the first transistor M1. The storage capacitor Cst charges a voltage corresponding to the data signal supplied to the first node N1 during each frame period.

The third transistor M3 may be connected between the first connection electrode ELT1 (or the second electrode of the first transistor M1) and the sensing line SENL. For example, a gate electrode of the third transistor M3 may be connected to the sensing signal line SSL. The third transistor M3 may transfer a voltage value applied to the first connection electrode ELT1 to the sensing line SENL according to a sensing signal supplied to the sensing signal line SSL. The voltage value transferred through the sensing line SENL may be provided to an external circuit (e.g., a timing controller), and the external circuit may extract characteristic information (e.g., the threshold voltage of the first transistor M1, etc.), based on the provided voltage value. The extracted characteristic information may be used to convert image data such that a characteristic deviation between the pixels PXL may be compensated.

Although a case where the transistors included in the pixel circuit PXC are all implemented with an n-type transistor has been illustrated in FIG. 4, embodiments are not limited thereto. For example, at least one of the first, second, and third transistors M1, M2, and M3 may be changed to a p-type transistor.

For example, the structure and driving method of the pixel PXL may be variously changed in some embodiments. For example, the pixel circuit PXC may be formed as a pixel circuit having various structures and/or various driving methods, in addition to the embodiment shown in FIG. 4.

In an example, the pixel circuit PXC may not include the third transistor M3. Also, the pixel circuit PXC may further include other circuit elements such as a compensation transistor for compensating for the threshold voltage of the first transistor M1, an initialization transistor for initializing a voltage of the first node N1 and/or the first connection electrode ELT1, an emission control transistor for controlling a period in which a driving current is supplied to the light emitting unit EMU, and/or a boosting capacitor for boosting the voltage of the first node N1.

The light emitting unit EMU may include at least one light emitting element LD, e.g., light emitting elements LD connected between the first power source VDD and a second power source VSS.

For example, the light emitting unit EMU may include the first connection electrode ELT1 connected to the first power source VDD through the pixel circuit PXC and a first power line PL1, a fifth connection electrode ELT5 connected to the second power source VSS through a second power line PL2, and light emitting elements LD connected between the first and fifth connection electrodes ELT1 and ELT5.

The first power source VDD and the second power source VSS may have different potentials such that the light emitting elements LD may emit light. In an example, the first power source VDD may be set as a high-potential power source, and the second power source VSS may be set as a low-potential power source.

In an embodiment, the light emitting unit EMU may include at least one serial stage. Each serial stage may include a pair of electrodes (e.g., two electrodes) and at least one light emitting element LD connected in a forward-bias direction between the pair of electrodes. The number of serial stages constituting the light emitting unit EMU and the number of light emitting elements LD constituting each serial stage are not limited thereto. In an example, numbers of light emitting elements LD constituting the respective serial stages may be equal to or different from each other, and a number of light emitting elements LD is not limited thereto.

For example, the light emitting unit EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first connection electrode ELT1, a second connection electrode ELT2, and at least one first light emitting element LD1 connected between the first and second connection electrodes ELT1 and ELT2. Each first light emitting element LD1 may be connected in the forward-bias direction between the first and second connection electrodes ELT1 and EL2. For example, a first end portion EP1 of the first light emitting element LD1 may be connected to the first connection electrode ELT1, and a second end portion EP2 of the first light emitting element LD1 may be connected to the second connection electrode ELT2.

The second serial stage may include the second connection electrode ELT2 and a third connection electrode ELT3, and at least one second light emitting elements LD2 connected between the second and third connection electrodes ELT2 and ELT3. Each second light emitting element LD2 may be connected in the forward-bias direction between the second and third connection electrodes ELT2 and ELT3. For example, a first end portion EP1 of the second light emitting element LD2 may be connected to the second connection electrode ELT2, and a second end portion EP2 of the second light emitting element LD2 may be connected to the third connection electrode ELT3.

The third serial stage may include the third connection electrode ELT3 and a fourth connection electrode ELT4, and at least one third light emitting elements LD3 connected between the third and fourth connection electrodes ELT3 and ELT4. Each third light emitting element LD3 may be connected in the forward-bias direction between the third and fourth connection electrodes ELT3 and ELT4. For example, a first end portion EP1 of the third light emitting element LD3 may be connected to the third connection electrode ELT3, and a second end portion EP2 of the third light emitting element LD3 may be connected to the fourth connection electrode ELT4.

The fourth serial stage may include the fourth connection electrode ELT4 and the fifth connection electrode ELT5, and at least one fourth light emitting elements LD4 connected between the fourth and fifth connection electrodes ELT4 and ELT5. Each fourth light emitting element LD4 may be connected in the forward-bias direction between the fourth and fifth connection electrodes ELT4 and ELT5. For example, a first end portion EP1 of the fourth light emitting element LD4 may be connected to the fourth connection electrode ELT4, and a second end portion EP2 of the fourth light emitting element LD4 may be connected to the fifth connection electrode ELT5.

A first electrode, e.g., the first connection electrode ELT1 of the light emitting unit EMU may be an anode electrode of the light emitting unit EMU. A last electrode, e.g., the fifth connection electrode ELT5 of the light emitting unit EMU may be a cathode electrode of the light emitting unit EMU.

The other electrodes, e.g., the second connection electrode ELT2, the third connection electrode ELT3, and/or the fourth connection electrode ELT4 of the light emitting unit EMU may constitute respective intermediate electrodes. For example, the second connection electrode ELT2 may constitute a first intermediate electrode IET1, the third connection electrode ELT3 may constitute a second intermediate electrode IET2, and the fourth connection electrode ELT4 may constitute a third intermediate electrode IET3.

In case that light emitting elements LD are connected in a series/parallel structure, power efficiency may be improved as compared with in case that light emitting elements LD of which number is substantially equal to that of the above-described light emitting elements LD are connected only in parallel. For example, in the pixel in which the light emitting elements LD are connected in the series/parallel structure, although a short circuit defect or the like occurs in some serial stages, a specific luminance may be expressed through light emitting elements LD of the other serial stage. Hence, the probability that a dark spot defect will occur in the pixel PXL may be reduced. However, embodiments are not limited thereto, and the light emitting unit EMU may be formed by connecting the light emitting elements LD only in series or by connecting the light emitting elements LD only in parallel.

Each of the light emitting element LD may include a first end portion EP1 (e.g., a p-type end portion) connected to the first power source VDD via at least one electrode (e.g., the first connection electrode ELT1), the pixel circuit PXC, and/or the first power line PL1, and a second end portion EP2 (e.g., an n-type end portion) connected to the second power source VSS via at least another electrode (e.g., the fifth connection electrode ELT5) and the second power line PL2. For example, the light emitting elements LD may be connected in the forward-bias direction between the first power source VDD and the second power source VSS. The light emitting elements LD connected in the forward-bias direction may constitute effective light sources of the light emitting unit EMU.

In case that a driving current is supplied through the corresponding pixel circuit PXC, the light emitting elements LD may emit light with a luminance corresponding to the driving current. For example, during each frame period, the pixel circuit PXC may supply, to the light emitting unit EMU, a driving current corresponding to a grayscale value of a corresponding frame. Accordingly, in case that the light emitting elements LD emit light with the luminance corresponding to the driving current, the light emitting unit EMU may express the luminance corresponding to the driving current.

Figure 5:
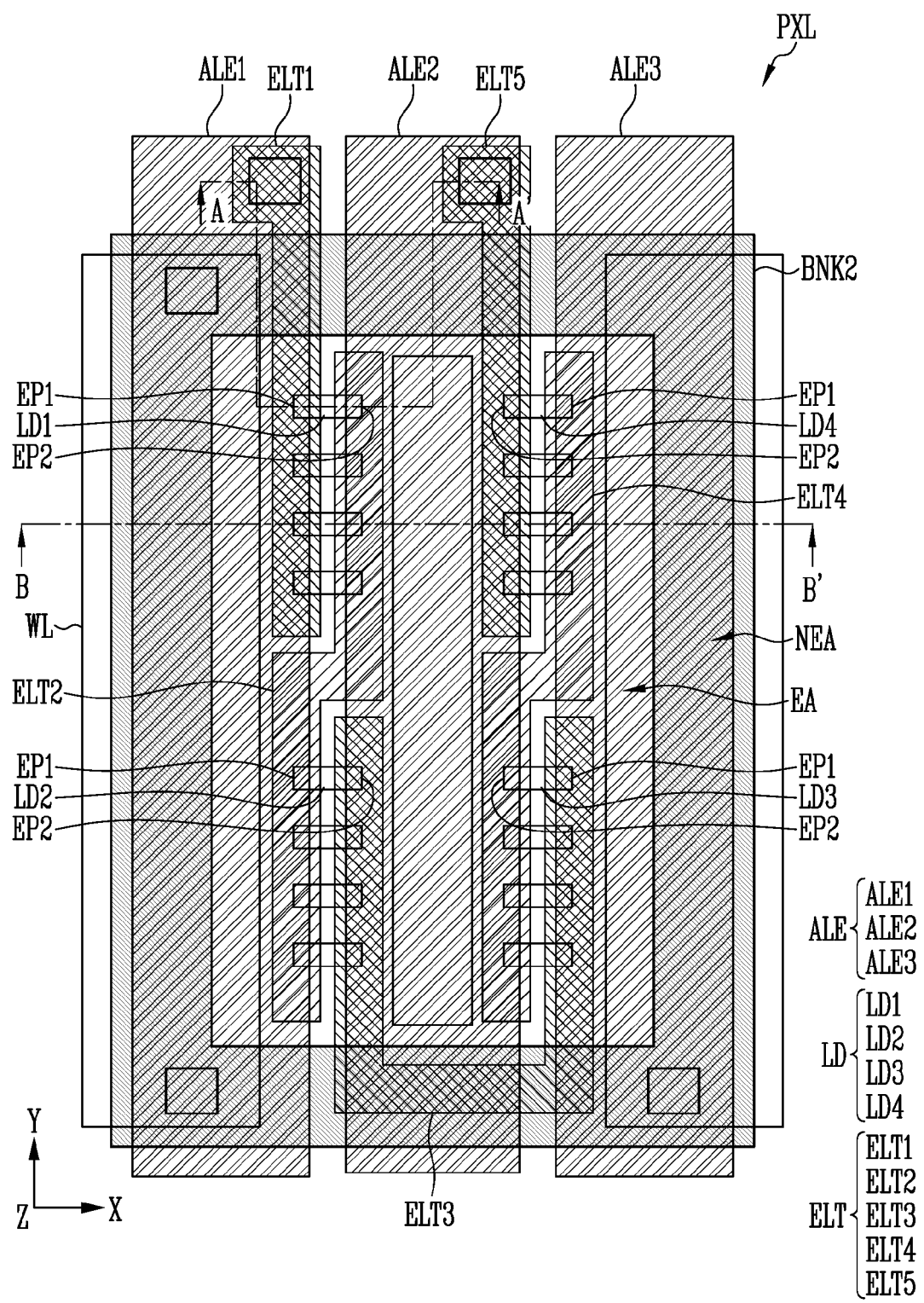
FIGS. 5 and 6 are schematic plan views illustrating a pixel in accordance with an embodiment.
Figure 6:
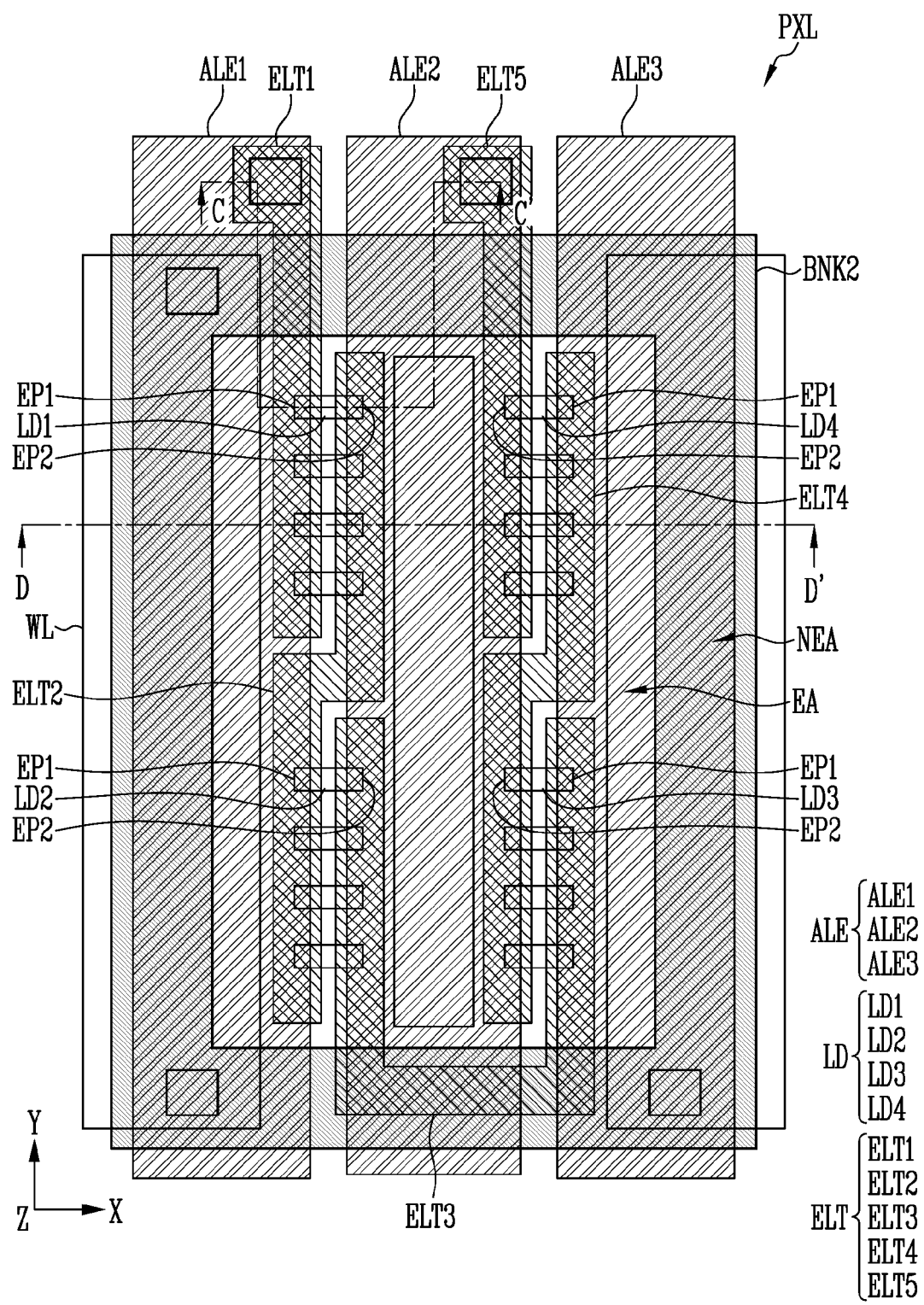
Figure 7:
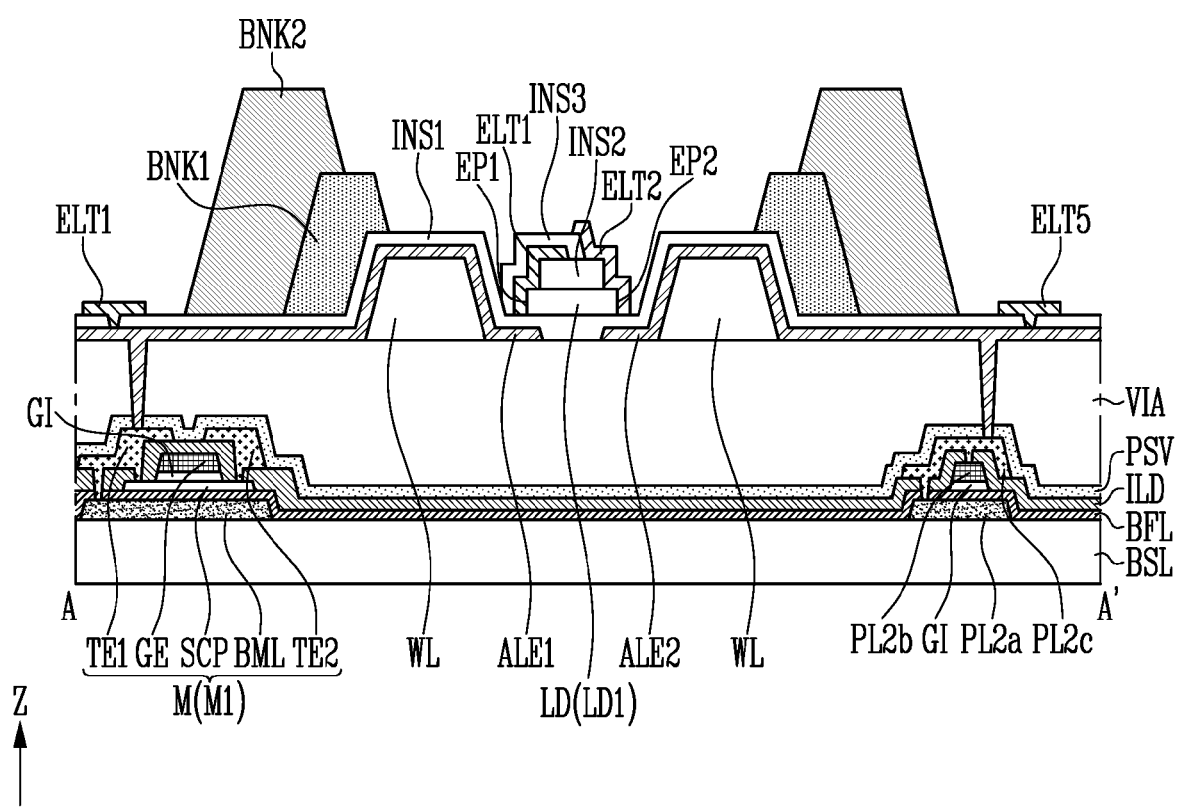
FIG. 7 is a schematic sectional view taken along line A-A' shown in FIG. 5.
Figure 8:
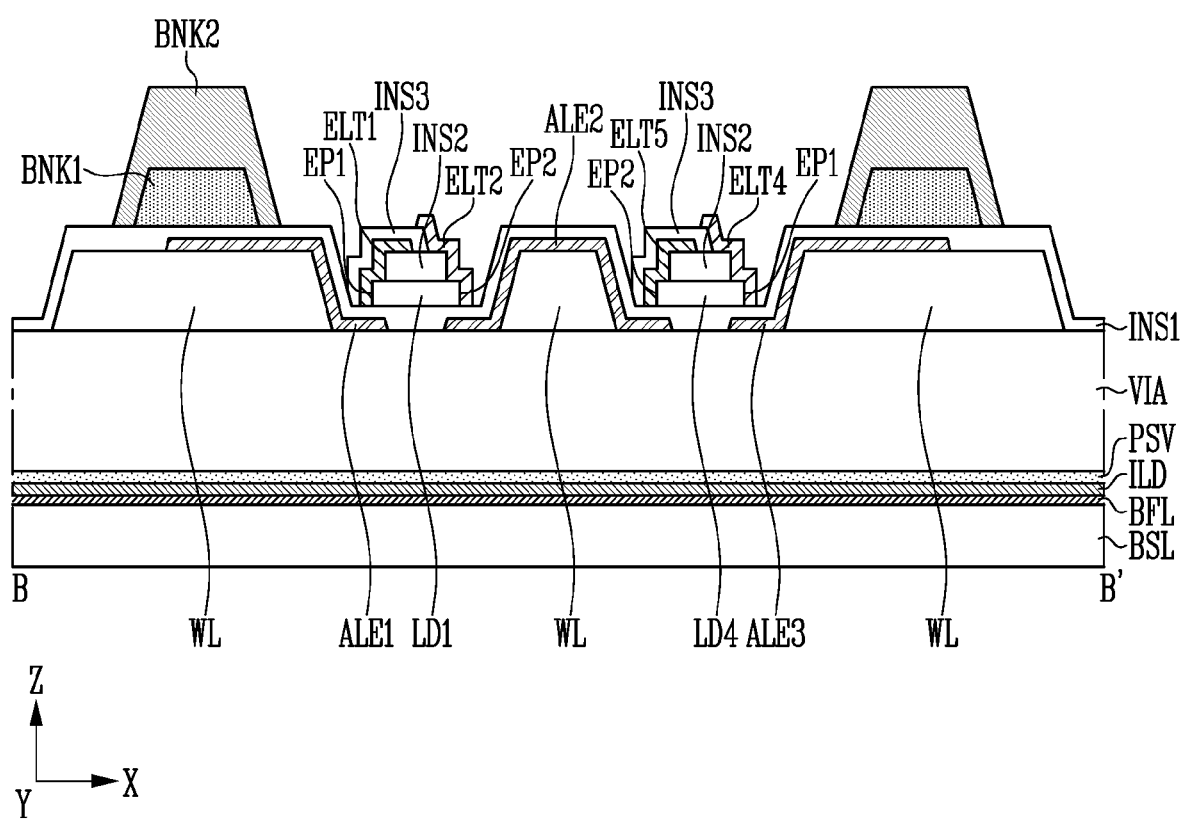
FIG. 8 is a schematic sectional view taken along line B-B' shown in FIG. 5.
Figure 9:
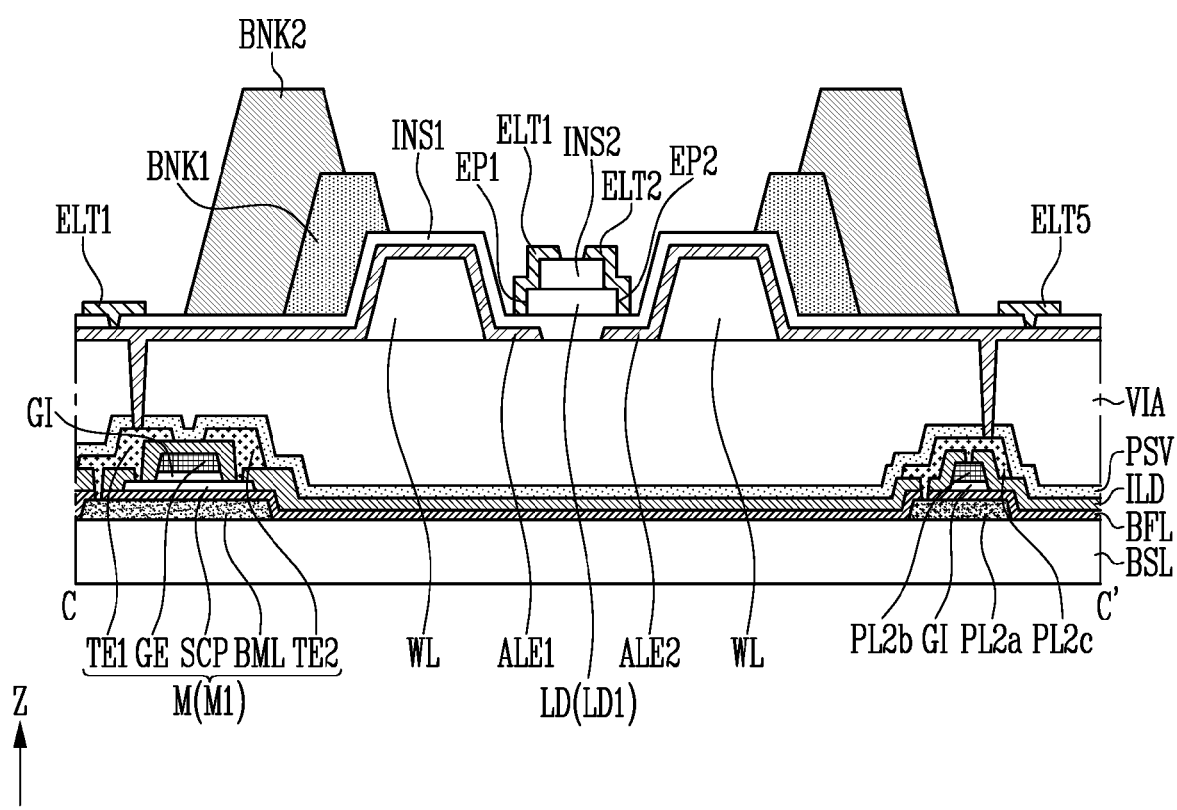
FIG. 9 is a schematic sectional view taken along line C-C' shown in FIG. 6.
Figure 10:
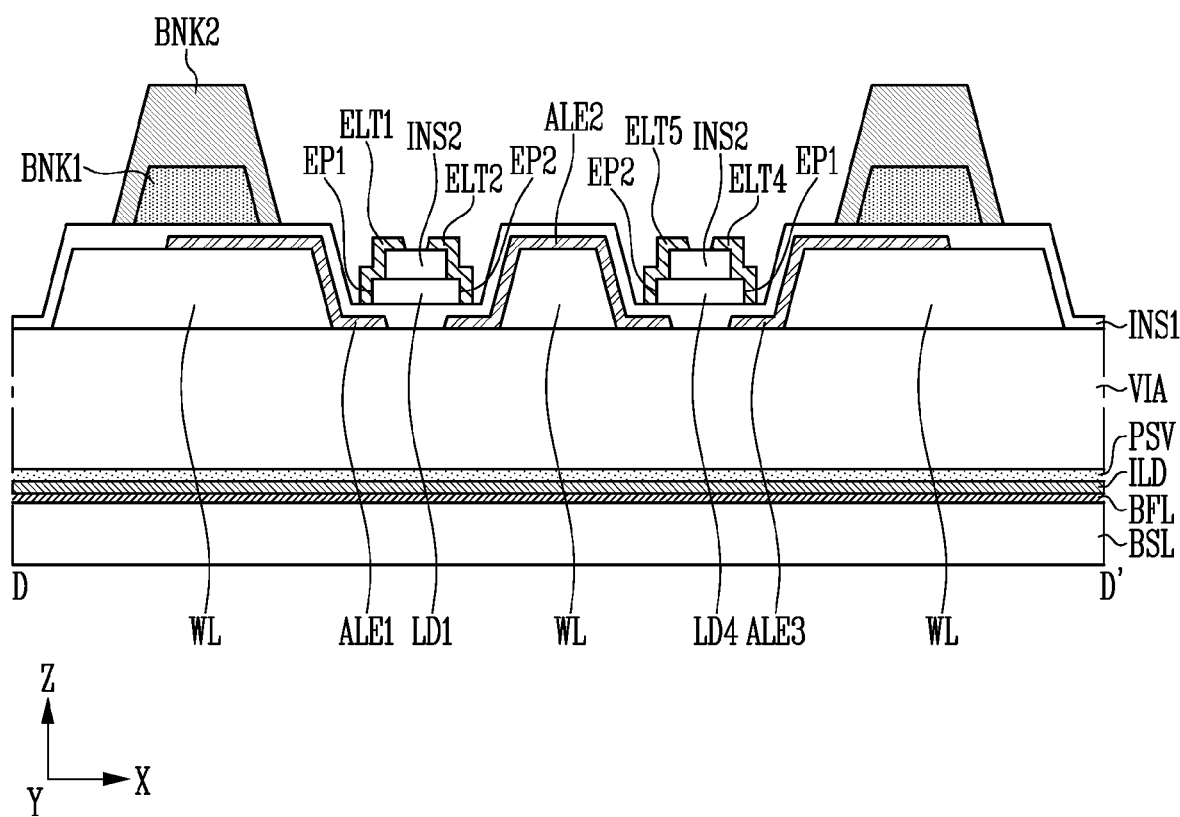
FIG. 10 is a schematic sectional view taken along line D-D' shown in FIG. 6.

FIGS. 5 and 6 are schematic plan views illustrating a pixel in accordance with an embodiment. FIG. 7 is a schematic sectional view taken along line A-A' shown in FIG. 5. FIG. 8 is a schematic sectional view taken along line B-B' shown in FIG. 5. FIG. 9 is a schematic sectional view taken along line C-C' shown in FIG. 6. FIG. 10 is a schematic sectional view taken along line D-D' shown in FIG. 6.

In an example, the pixel PXL shown in FIGS. 5 and 6 may be any one of the first to third pixels PXL1, PXL2, and PXL3 constituting the pixel unit PXU shown in FIG. 3, and the first to third pixels PXL1, PXL2, and PXL3 may have structures substantially identical or similar to one another. For example, although an embodiment in which each pixel PXL includes light emitting elements LD disposed in four serial stages as shown in FIG. 4 is disclosed in FIGS. 5 and 6, the number of serial stages of each pixel PXL may be variously changed in some embodiments.

Hereinafter, in case that at least one of first to fourth light emitting elements LD1, LD2, LD3, and LD4 is arbitrarily designated (or mentioned) or in case that two or more kinds of light emitting elements are inclusively designated(or mentioned), the corresponding light emitting element or the corresponding light emitting elements will be referred to as a "light emitting element LD" or "light emitting elements LD." For example, in case that at least one electrode among electrodes including first to third electrodes ALE1, ALE2, and ALE3 is arbitrarily designated (or mentioned) or in case that two or more kinds of electrodes are inclusively designated (or mentioned), the corresponding electrode or the corresponding electrodes will be referred to as an "electrode ALE" or "electrodes ALE." In case that at least one connection electrode among connection electrodes including first to fifth connection electrodes ELT1, ELT2, ELT3, ELT4, and ELT5 is arbitrarily designated (or mentioned) or in case that two or more kinds of connection electrodes are inclusively designated (or mentioned), the corresponding connection electrode or the corresponding connection electrodes will be referred to as a "connection electrode ELT" or "connection electrodes ELT."

Referring to FIGS. 5 and 6, each pixel PXL may include an emission area EA and a non-emission area NEA. The emission area EA may be an area including light emitting elements LD to emit light. The non-emission area NEA may surround the emission area EA. The non-emission area NEA may be an area in which a second bank BNK2 surrounding the emission area EA is disposed. The second bank BNK2 may be disposed in the non-emission area NEA to at least partially surround the emission area EA.

The second bank BNK2 may include an opening overlapping the emission area EA. The opening of the second bank BNK2 may provide a space in which a color conversion layer which will be described below may be disposed. For example, a specific kind and/or a specific amount of color conversion layer may be supplied to the space defined (or partitioned) by the opening of the second bank BNK2. The second bank BNK2 will be described in detail below with reference to FIG. 13.

Each pixel PXL may include wall layers (or partition walls) WL, electrodes ALE, light emitting elements LD, and/or connection electrodes ELT.

The wall layers WL may be disposed in at least the emission area EA. The wall layers WL may be at least partially disposed in the non-emission area NEA. The wall layers WL may extend along a second direction (e.g., Y-axis direction), and be spaced apart from each other along a first direction (e.g., X-axis direction).

Each of the wall layers WL may overlap (e.g., partially overlap) at least one electrode ALE (e.g., an alignment electrode) in at least the emission area EA. For example, the wall layers WL may be disposed on the bottom of the electrodes ALE. As the wall layer WL is disposed on the bottom of one area of each of the electrodes ALE, the one area of each of the electrodes ALE (e.g., alignment electrodes) may protrude in an upper direction, i.e., a third direction (e.g., Z-axis direction) in an area in which the wall layer WL is formed. In case that the wall layers WL and/or the electrodes ALE include a reflective material, a reflective wall structure may be formed at the periphery of the light emitting elements LD. Accordingly, light emitted from the light emitting elements LD may be emitted in the upper direction of the pixel PXL (e.g., a front direction of the display panel PNL, including a specific viewing angle range), and thus light emission efficiency of the display panel PNL may be improved.

The electrodes ALE may be disposed in at least the emission area EA. The electrode ALE may extend along the second direction (e.g., Y-axis direction), and be spaced apart from each other along the first direction (e.g., X-axis direction).

Each of first to third electrodes ALE1, ALE2, and ALE3 may extend along the second direction (e.g., Y-axis direction), and the first to third electrodes ALE1, ALE2, and ALE3 may be spaced apart from each other along the first direction (e.g., X-axis direction) to be sequentially disposed. Some of the electrodes ALE may be connected to the pixel circuit (PXC shown in FIG. 4) and/or a specific power line through contact holes. For example, the first electrode ALE1 may be connected to the pixel circuit PXC and/or the first power line PL1 through a contact hole, and the third electrode ALE3 may be connected to the second power line PL2 through a contact hole.

In some embodiments, some of the electrodes ALE may be connected (e.g., electrically connected) to some of the connection electrodes ELT through contact holes. For example, the first electrode ALE1 may be connected (e.g., electrically connected) to a first connection electrode ELT1 through a contact hole, and the second electrode ALE2 may be connected (e.g., electrically connected) to a fifth connection electrode ELT5 through a contact hole.

A pair of electrodes ALE adjacent to each other may be supplied with different signals in a process of aligning the light emitting elements LD. For example, in case that the first to third electrodes ALE1, ALE2, and ALE3 are sequentially arranged along the first direction (e.g., X-axis direction), the first electrode ALE1 and the second electrode ALE2 may be supplied with different alignment signals, and the second electrode ALE2 and the third electrode ALE3 may be supplied with different alignment signals.

Each of the light emitting elements LD may be aligned between a pair of electrodes ALE in the emission area EA. Also, each of the light emitting elements LD may be connected (e.g., electrically connected) between a pair of connection electrodes ELT.

A first light emitting element LD1 may be aligned between the first and second electrodes ALE1 and ALE2. The first light emitting element LD1 may be connected (e.g., electrically connected) between the first connection electrode ELT1 and a second connection electrode ELT2. In an example, the first light emitting element LD1 may be aligned in a first area (e.g., an upper end area) of the first and second electrodes ALE1 and ALE2. A first end portion EP1 of the first light emitting element LD1 may be connected (e.g., electrically connected) to the first connection electrode ELT1, and a second end portion EP2 of the first light emitting element LD1 may be connected (e.g., electrically connected) to the second connection electrode ELT2.

A second light emitting element LD2 may be aligned between the first and second electrodes ALE1 and ALE2. The second light emitting element LD2 may be connected (e.g., electrically connected) between the second connection electrode ELT2 and a third connection electrode ELT3. In an example, the second light emitting element LD2 may be aligned in a second area (e.g., a lower end area) of the first and second electrodes ALE1 and ALE2. A first end portion EP1 of the second light emitting element LD2 may be connected (e.g., electrically connected) to the second connection electrode ELT2, and a second end portion EP2 of the second light emitting element LD2 may be connected (e.g., electrically connected) to the third connection electrode ELT3.

A third light emitting element LD3 may be aligned between the second and third electrodes ALE2 and ALE3. The third light emitting element LD3 may be connected (e.g., electrically connected) between the third connection electrode ELT3 and a fourth connection electrode ELT4. In an example, the third light emitting element LD3 may be aligned in a second area (e.g., a lower end area) of the second and third electrodes ALE2 and ALE3. A first end portion EP1 of the third light emitting element LD3 may be connected (e.g., electrically connected) to the third connection electrode ELT3, and a second end portion EP2 of the third light emitting element LD3 may be connected (e.g., electrically connected) to the fourth connection electrode ELT4.

A fourth light emitting element LD4 may be aligned between the second and third electrodes ALE2 and ALE3. The fourth light emitting element LD4 may be connected (e.g., electrically connected) between the fourth and fifth connection electrodes ELT4 and ELT5. In an example, the fourth light emitting element LD4 may be aligned in a first area (e.g., an upper end area) of the second and third electrodes ALE2 and ALE3. A first end portion EP1 of the fourth light emitting element LD4 may be connected (e.g., electrically connected) to the fourth connection electrode ELT4, and a second end portion EP2 of the fourth light emitting element LD4 may be connected (e.g., electrically connected) to the fifth connection electrode ELT5.

In an example, the first light emitting element LD1 may be positioned in a left upper end area of the emission area EA, and the second light emitting element LD2 may be positioned in a left lower end area of the emission area EA. The third light emitting elements LD3 may be positioned at a right lower end area of the emission area EA, and the fourth light emitting element LD4 may be positioned in a right upper end area of the emission area EA. However, the arrangement and/or connection structure of the light emitting elements LD may be variously changed according to the structure of the light emitting unit EMU and/or the number of serial stages.

Each of the connection electrodes ELT may be disposed in at least the emission area EA, and may overlap at least one electrode ALE and/or at least one light emitting element LD. For example, each of the connection electrodes ELT may be formed on the electrodes ALE and/or the light emitting elements LD to overlap the electrodes ALE and/or the light emitting elements LD. Therefore, each of the connection electrodes ELT may be connected (e.g., electrically connected) to the light emitting elements LD.

The first connection electrode ELT1 may be disposed on a first area (e.g., an upper end area) of the first electrode ALE1 and the first end portions EP1 of the first light emitting elements LD1 and may be connected (e.g., electrically connected) to the first end portions EP1 of the first light emitting elements LD1.

The second connection electrode ELT2 may be disposed on a first area (e.g., an upper end area) of the second electrode ALE2 and the second end portions EP2 of the first light emitting elements LD1 and may be connected (e.g., electrically connected) to the second end portions EP2 of the first light emitting elements LD1. Also, the second connection electrode ELT2 may be disposed on a second area (e.g., a lower end area) of the first electrode ALE1 and the first end portions EP1 of the second light emitting elements LD2 and may be connected (e.g., electrically connected) to the first end portions EP1 of the second light emitting elements LD2. For example, the second connection electrode ELT2 may connect (e.g., electrically connect) the second end portions EP2 of the first light emitting elements LD1 and the first end portions EP1 of the second light emitting elements LD2 to each other in the emission area EA. For example, the second connection electrode ELT2 may have a bent shape. For example, the second connection electrode ELT2 may have a structure bent or curved at a boundary between an area in which at least one first light emitting element LD1 is arranged and an area in which at least one second light emitting element LD2 is arranged.

The third connection electrode ELT3 may be disposed on a second area (e.g., a lower end area) of the second electrode ALE2 and the second end portions EP2 of the second light emitting elements LD2 and may be connected (e.g., electrically connected) to the second end portions EP2 of the second light emitting elements LD2. Also, the third connection electrode ELT3 may be disposed on a second area (e.g., a lower end area) of the third electrode ALE3 and the first end portions EP1 of the third light emitting elements LD3 and may be connected (e.g., electrically connected) to the first end portions EP1 of the third light emitting elements LD3. For example, the third connection electrode ELT3 may connect (e.g., electrically connect) the second end portions EP2 of the second light emitting elements LD2 and the first end portions EP1 of the third light emitting elements LD3 to each other in the emission area EA. For example, the third connection electrode ELT3 may have a bent shape. For example, the third connection electrode ELT3 may have a structure bent or curved at a boundary between an area in which at least one second light emitting element LD2 is arranged and an area in which at least one third light emitting element LD3 is arranged.

The fourth connection electrode ELT3 may be disposed on the second area (e.g., the lower end area) of the second electrode ALE2 and the second end portions EP2 of the third light emitting elements LD3 and may be connected (e.g., electrically connected) to the second end portions EP2 of the third light emitting elements LD3. Also, the fourth connection electrode ELT4 may be disposed on a first area (e.g., an upper end area) of the third electrode ALE3 and the first end portions EP1 of the fourth light emitting elements LD4 and may be connected (e.g., electrically connected) to the first end portions EP1 of the fourth light emitting elements LD4. For example, the fourth connection electrode ELT4 may connect (e.g., electrically connect) the second end portions EP2 of the third light emitting elements LD3 and the first end portions EP1 of the fourth light emitting elements LD4 to each other in the emission area EA. For example, the fourth connection electrode ELT4 may have a bent shape. For example, the fourth connection electrode ELT4 may have a structure bent or curved at a boundary between an area in which at least one third light emitting element LD3 is arranged and an area in which at least one fourth light emitting element LD4 is arranged.

The fifth connection electrode ELT5 may be disposed on the first area (e.g., the upper end area) of the second electrode ALE2 and the second end portions EP2 of the fourth light emitting elements LD4 and may be connected (e.g., electrically connected) to the second end portions EP2 of the fourth light emitting elements LD4.

The first connection electrode ELT1, the third connection electrode ELT3, and/or the fifth connection electrode ELT5 may be formed as the same conductive layer. For example, the second connection electrode ELT2 and the fourth connection electrode ELT4 may be formed as the same conductive layer. In an example, the connection electrodes ELT may be formed as conductive layers as shown in FIG. 5. For example, the first connection electrode ELT1, the third connection electrode ELT3, and/or the fifth connection electrode ELT5 may be formed as a first conductive layer, and the second connection electrode ELT2 and the fourth connection electrode ELT4 may be formed as a second conductive layer different from the first conductive layer. In another example, the first to fifth connection electrodes ELT1, ELT2, ELT3, ELT4, and ELT5 may be formed as the same conductive layer as shown in FIG. 6. As described above, in case that the first to fifth connection electrodes ELT1, ELT2, ELT3, ELT4, and ELT5 are formed as the same conductive layer, the number of masks may be decreased, and manufacturing processes may be simplified.

In the above-described manner, the light emitting elements LD aligned between the electrodes ALE may be connected in a specific (or regular) form by using the connection electrodes ELT. For example, the first light emitting elements LD1, the second light emitting elements LD2, the third light emitting elements LD3, and the fourth light emitting elements LD4 may be sequentially connected in series by using the connection electrodes ELT.

Hereinafter, a sectional structure of the pixel PXL will be described in detail with reference to FIGS. 7 to 10. The first transistor M1 among various circuit elements constituting the pixel circuit (e.g., PXC shown in FIG. 4) is illustrated in FIGS. 7 and 9. In case that the first to third transistors M1, M2, and M3 are designated (or mentioned) without being distinguished from each other, each of the first to third transistors M1, M2, and M3 will be inclusively referred to as a "transistor M." The structure of transistors M and/or the positions of the transistors M for each layer is not limited to the embodiment shown in FIGS. 7 and 9, and may be variously changed in some embodiments.

Each pixel PXL in accordance with an embodiment may include circuit elements including transistors M disposed on a base layer BSL and various lines connected thereto. Electrodes ALE, light emitting elements LD, connection electrodes ELT, a first bank BNK1, and/or a second bank BNK2, which constitute a light emitting unit EMU, may be disposed above the circuit elements.

The base layer BSL may be used to constitute a base member, and may be a rigid or flexible substrate or a film. In an example, the base layer BSL may be a rigid substrate made of glass or tempered glass, a flexible substrate (or thin film) made of a plastic or metal material, or at least one insulating layer. The material and/or property of the base layer BSL is not limited thereto. In an embodiment, the base layer BSL may be substantially transparent. The term "substantially transparent" means that light may be transmitted with a specific transmittance or more. In another example, the base layer BSL may be translucent or opaque. Also, the base layer BSL may include a reflective material in some embodiments.

A lower conductive layer BML and a first power conductive layer PL2a may be disposed on the base layer BSL. The lower conductive layer BML and the first power conductive layer PL2a may be disposed (or included) in the same layer. For example, the lower conductive layer BML and the first power conductive layer PL2a may be formed (e.g., simultaneously formed) by the same process, but embodiments are not limited thereto. The first power conductive layer PL2a may constitute the second power line PL2 described with reference to FIG. 4 and the like.

Each of the lower conductive layer BML and the first power conductive layer PL2a may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or ally thereof.

A buffer layer BFL may be disposed over the lower conductive layer BML and the first power conductive layer PL2a. The buffer layer BFL may prevent an impurity from being diffused into each circuit element. The buffer layer BFL may be formed as a single layer, but be formed as a multi-layer including at least two layers. In case that the buffer layer BFL is formed as the multi-layer, the layers may be formed of the same material or be formed of different materials.

A semiconductor pattern SCP may be disposed on the buffer layer BFL. In an example, the semiconductor pattern SCP may include a first region in contact with a first transistor electrode TE1, a second region in contact with a second transistor electrode TE2, and a channel region positioned between the first and second regions. In some embodiments, one of the first and second regions may be a source region, and the other of the first and second regions may be a drain region.

In some embodiments, the semiconductor pattern SCP may be made of poly-silicon, amorphous silicon, oxide semiconductor, etc. For example, the channel region of the semiconductor pattern SCP may be a semiconductor pattern undoped with an impurity, and may be an intrinsic semiconductor. Each of the first and second regions of the semiconductor pattern SCP may be a semiconductor pattern doped with a specific impurity.

A gate insulating layer GI may be disposed on the buffer layer BFL and the semiconductor pattern SCP. In an example, the gate insulating layer GI may be disposed between the semiconductor pattern SCP and a gate electrode GE. Also, the gate insulating layer GI may be disposed between the buffer layer BFL and a second power conductive layer PL2b. The gate insulating layer GI may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE of the transistor M and the second power conductive layer PL2b may be disposed on the gate insulating layer GI. For example, the gate electrode GE and the second power conductive layer PL2b may be disposed (or included) in the same layer. For example, the gate electrode GE and the second power conductive layer PL2b may be formed (e.g., simultaneously formed) by the same process, but embodiments are not limited thereto. The gate electrode GE may be disposed on the gate insulating layer GI to overlap the semiconductor pattern SCP in the third direction (e.g., Z-axis direction). The second power conductive layer PL2b may be disposed on the gate insulating layer GI to overlap the first power conductive layer PL2a in the third direction (e.g., Z-axis direction). The second power conductive layer PL2b along with the first power conductive layer PL2a may constitute the second power line PL2 described with reference to FIG. 4 and the like.

Each of the gate electrode GE and the second power conductive layer PL2b may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or ally thereof. For example, each of the gate electrode GE and the second power conductive layer PL2b may be formed as a multi-layer in which titanium (Ti), copper (Cu), and/or indium tin oxide (ITO) are sequentially or repeatedly stacked.

An interlayer insulating layer ILD may be disposed over the gate electrode GE and the second power conductive layer PL2b. In an example, the interlayer insulating layer ILD may be disposed between the gate electrode GE and the first and second transistor electrodes TE1 and TE2. Also, the interlayer insulating layer ILD may be disposed between the second power conductive layer PL2b and a third power conductive layer PL2c.

The interlayer insulating layer ILD may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be disposed (or included) in the same layer. For example, the first and second transistor electrodes TE1 and TE2 and the third power conductive layer PL2c may be formed (e.g., simultaneously formed) by the same process, but embodiments are not limited thereto.

The first and second transistor electrodes TE1 and TE2 may overlap the semiconductor pattern SCP in the third direction (e.g., Z-axis direction). The first and second transistor electrodes TE1 and TE2 may be connected (e.g., electrically connected) to the semiconductor pattern SCP. For example, the first transistor electrode TE1 may be connected (e.g., electrically connected) to the first region of the semiconductor pattern SCP through a contact hole penetrating the interlayer insulating layer ILD. Also, the first transistor electrode TE1 may be connected (e.g., electrically connected) to the lower conductive layer BML through a contact hole penetrating the interlayer insulating layer ILD and the buffer layer BFL. The second transistor electrode TE2 may be connected (e.g., electrically connected) to the second region of the semiconductor pattern SCP through a contact hole penetrating the interlayer insulating layer ILD. In some embodiments, any one of the first and second transistor electrodes TE1 and TE2 may be a source electrode, and the other of the first and second transistor electrodes TE1 and TE2 may be a drain electrode.

The third power conductive layer PL2c may overlap the first power conductive layer PL2a and/or the second power conductive layer PL2b in the third direction (e.g., Z-axis direction). The third power conductive layer PL2c may be connected (e.g., electrically connected) to the first power conductive layer PL2a and/or the second power conductive layer PL2b. For example, the third power conductive layer PL2c may be connected (e.g., electrically connected) to the first power conductive layer PL2a through a contact hole penetrating the interlayer insulating layer ILD and the buffer layer BFL. Also, the third power conductive layer PL2c may be connected (e.g., electrically connected) to the second power conductive layer PL2b through a contact hole penetrating the interlayer insulating layer ILD. The third power conductive layer PL2c along with the first power conductive layer PL2a and/or the second power conductive layer PL2b may constitute the second power line PL2 described with reference to FIG. 4 and the like.

The first and second transistor electrodes TE1 and TE2 and the third power conductive layer PL2c may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or ally thereof.

A protective layer PSV may be disposed over the first and second transistor electrodes TE1 and TE2 and the third power conductive layer PL2c. The protective layer PSV may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A via layer VIA may be disposed on the protective layer PSV. The via layer VIA may be made of an organic material to planarize a lower step difference. For example, the via layer VIA may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, embodiments are not limited thereto, and the via layer VIA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Wall layer (or partition walls) WL may be disposed on the via layer VIA. The wall layers WL may function to form a specific step difference such that the light emitting elements LD may be readily aligned in the emission area EA.

In some embodiments, the wall layers WL may have various shapes. In an embodiment, the wall layers WL may have a shape protruding in the third direction (e.g., Z-axis direction) on the base layer BSL. Also, the wall layers WL may have an inclined surface inclined at a specific angle with respect to the base layer BSL. However, embodiments are not limited thereto, and the wall layers WL may have a sidewall having a curved shape, a stepped shape, or the like. In an example, the wall layers WL may have a section having a semicircular shape, a semi-elliptical shape, or the like.

The wall layers WL may include at least one organic material and/or at least one inorganic material. In an example, the wall layers WL may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, embodiments are not limited thereto, and the wall layers WL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Electrodes ALE may be disposed on the via layer VIA and the wall layers WL. The electrodes ALE may at least partially cover side surfaces and/or top surfaces of the wall layers WL. The electrodes ALE disposed on the top of the wall layers WL may have a shape corresponding to the wall layer WL. In an example, the electrodes ALE disposed on the wall layers WL may include an inclined surface or a curved surface, which has a shape corresponding to the shape of the wall layers WL. The wall layers WL and the electrodes ALE may function as a reflective member, may reflect light emitted from the light emitting elements LD, and may guide the reflected light in a front direction of the pixel PXL, i.e., the third direction (e.g., Z-axis direction). Thus, the light emission efficiency of the display panel PNL may be improved or enhanced.

The electrodes ALE may be spaced apart from each other. The electrodes ALE may be disposed (or included) in the same layer. For example, the electrodes ALE may be formed (e.g., simultaneously formed) by the same process, but embodiments are not limited thereto.

The electrodes ALE may be supplied with an alignment signal in a process of aligning the light emitting elements LD. Accordingly, an electric filed may be formed between the electrodes ALE, so that the light emitting elements LD disposed in each pixel PXL may be aligned between the electrodes ALE.

The electrodes ALE may include at least one conductive material. In an example, the electrodes ALE may include at least one metal or any alloy including the same among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and at least one conductive material among conductive polymers such as PEDOT, but embodiments are not limited thereto.

A first electrode ALE1 may be connected (e.g., electrically connected) to the first transistor electrode TE1 of the transistor M through a contact hole penetrating the via layer VIA and the protective layer PSV. A second electrode ALE2 may be connected (e.g., electrically connected) to the third power conductive layer PL2c through a contact hole penetrating the via layer VIA and the protective layer PSV.

A first insulating layer INS1 may be disposed over the electrodes ALE. The first insulating layer INS1 may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A first bank BNK1 may be disposed on the first insulating layer INS1. The first bank BNK1 may include an opening overlapping the emission area EA. The opening of the first bank BNK1 may provide a space in which light emitting elements LD may be disposed in a process of supplying the light emitting elements LD to each of the pixels PXL. For example, a specific kind and/or a specific amount of light emitting element ink may be supplied to the space defined (or partitioned) by the opening of the first bank BNK1.

The first bank BNK1 may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, embodiments are not limited thereto, and the first bank BNK1 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Light emitting elements LD may be disposed between the electrodes ALE. The light emitting elements LD may be disposed in the opening of the first bank BNK1 to be disposed between the wall layers WL.

The light emitting elements LD may be prepared in a form in which the light emitting elements LD are dispersed in a light emitting element ink and may be supplied to each of the pixels PXL by an inkjet printing process, or the like. In an example, the light emitting elements LD may be dispersed in a volatile solvent to be provided to each pixel PXL. In case that an alignment signal is supplied through the electrodes ALE, the light emitting elements LD may be aligned between the electrodes ALE, in case that an electric field is formed between the electrodes ALE. After the light emitting elements LD are aligned, the solvent may be volatilized or removed by other processes, so that the light emitting elements LD may be stably arranged between the electrodes ALE.

A second insulating layer INS2 may be disposed on the light emitting elements LD. For example, the second insulating layer INS2 may be disposed (e.g., partially disposed) on the light emitting elements LD, and expose first and second end portions EP1 and EP2 of the light emitting elements LD. In case that the second insulating layer INS2 is formed on the light emitting elements LD after the alignment of the light emitting elements LD is completed, the light emitting elements LD may be prevented from being separated from positions at which the light emitting elements LD are aligned.

The second insulating layer INS2 may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The connection electrodes ELT may be disposed on the first and second end portions EP1 and EP2 of the light emitting elements LD, which are exposed by the second insulating layer INS2. A first connection electrode ELT1 may be disposed (e.g., directly disposed) on first end portions EP1 of first light emitting elements LD1 and may be in contact with the first end portions EP1 of the first light emitting elements LD1.

For example, a second connection electrode ELT2 may be disposed (e.g., directly disposed) on second end portions EP2 of the first light emitting elements LD1 and may be in contact with the second end portions EP2 of the first light emitting elements LD1. Also, the second connection electrode ELT2 may be disposed (e.g., directly disposed) on first end portions of second light emitting elements LD2 and may be in contact with the first end portions of the second light emitting elements LD2. For example, the second connection electrode ELT2 may connect (e.g., electrically connect) the second end portions EP2 of the first light emitting elements LD1 and the first end portions of the second light emitting elements LD2 to each other.

For example, a third connection electrode ELT3 may be disposed (e.g., directly disposed) on second end portions of the second light emitting elements LD2 and may be in contact with the second end portions of the second light emitting elements LD2. Also, the third connection electrode ELT3 may be disposed (e.g., directly disposed) on first end portions of third light emitting elements LD3 and may be in contact with the first end portions of the third light emitting elements LD3. For example, the third connection electrode ELT3 may connect (e.g., electrically connect) the second end portions of the second light emitting elements LD2 and the first end portions of the third light emitting elements LD3 to each other.

For example, a fourth connection electrode ELT4 may be disposed (e.g., directly disposed) on second end portions EP2 of the third light emitting elements LD3 and may be in contact with the second end portions EP2 of the third light emitting elements LD3. Also, the fourth connection electrode ELT4 may be disposed (e.g., directly disposed) on first end portions EP1 of fourth light emitting elements LD4 and may be in contact with the first end portions EP1 of the fourth light emitting elements LD4. For example, the fourth connection electrode ELT4 may connect (e.g., electrically connect) the second end portions EP2 of the third light emitting elements LD3 and the first end portions EP1 of the fourth light emitting elements LD4 to each other.

For example, a fifth connection electrode ELT5 may be disposed (e.g., directly disposed) on second end portions EP2 of the fourth light emitting elements LD4 and may be in contact with the second end portions EP2 of the fourth light emitting elements LD4.

The first connection electrode ELT1 may be connected (e.g., electrically connected) to the first electrode ALE1 through a contact hole penetrating the first insulating layer INS1. The fifth connection electrode ELT5 may be connected (e.g., electrically connected) to the second electrode ALE2 through a contact hole penetrating the first insulating layer INS1.

In an embodiment, the connection electrodes ELT may be formed as conductive layers. For example, the first connection electrode ELT1, the third connection electrode ELT3, and the fifth connection electrode ELT5 may be disposed (or included) in the same layer as shown in FIGS. 7 and 8. For example, the second connection electrode ELT2 and the fourth connection electrode ELT4 may be disposed (or included) in the same layer. The first connection electrode ELT1, the third connection electrode ELT3, and the fifth connection electrode ELT5 may be disposed on the second insulating layer INS2. A third insulating layer INS3 may be disposed over the first connection electrode ELT1, the third connection electrode ELT3, and the fifth connection electrode ELT5. The second connection electrode ELT2 and the fourth connection electrode ELT4 may be disposed on the third insulating layer INS3.

As described above, in case that the third insulating layer INS3 is disposed between the connection electrodes ELT formed as different conductive layers, the connection electrodes ELT may be stably separated from each other by the third insulating layer INS3, and thus the electrical stability between the first and second end portions EP1 and EP2 of the light emitting elements LD may be ensured.

The third insulating layer INS3 may be formed as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In another example, the connection electrodes ELT may be formed as the same conductive layer. For example, the first to fifth connection electrodes ELT1, ELT2, ELT3, ELT4, and ELT5 may be disposed (or included) in the same layer as shown in FIGS. 9 and 10. In an example, the first to fifth connection electrodes ELT1, ELT2, ELT3, ELT4, and ELT5 may be formed (e.g., simultaneously formed) by the same process. As described above, in case that the connection electrodes ELT are formed (e.g., simultaneously formed), the number of masks may be decreased, and a manufacturing process may be simplified.

The connection electrodes ELT may be made of various transparent conductive materials. In an example, the connection electrodes ELT may include at least one of various transparent conductive materials including Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and be implemented substantially transparently or translucently to satisfy a specific transmittance. Accordingly, light emitted from the first and second end portions EP1 and EP2 of the light emitting elements LD may be emitted to the outside of the display panel PNL with passing through the connection electrodes ELT.

A second bank BNK2 may be disposed on the first bank BNK1. The second bank BNK2 may include an opening overlapping the emission area EA. The opening of the second bank BNK2 may provide a space in which a color conversion layer which will be described above may be disposed. For example, a specific kind and/or a specific amount of color conversion layer may be supplied to the space defined (or partitioned) by the opening of the second bank BNK2. The second bank BNK2 will be described in detail with reference to FIG. 13.

Figure 11:
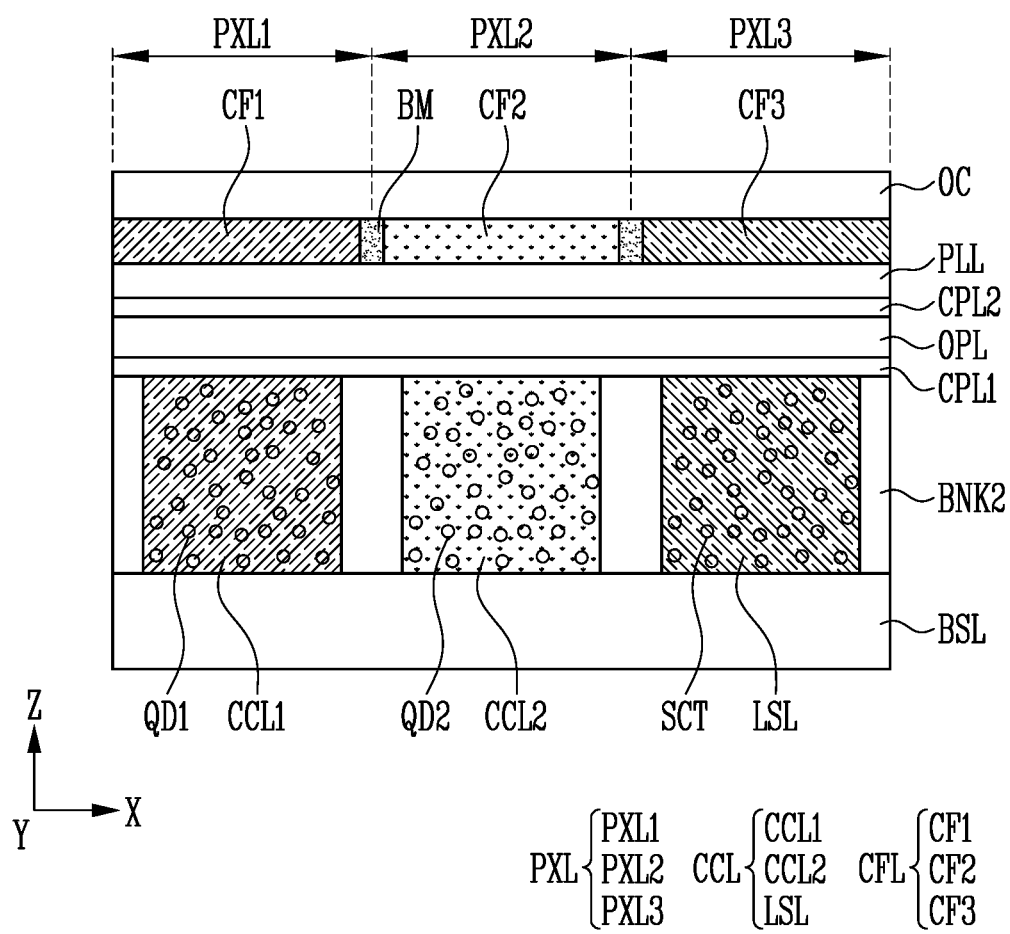
FIG. 11 is a schematic sectional view illustrating first to third pixels in accordance with an embodiment.
Figure 12:
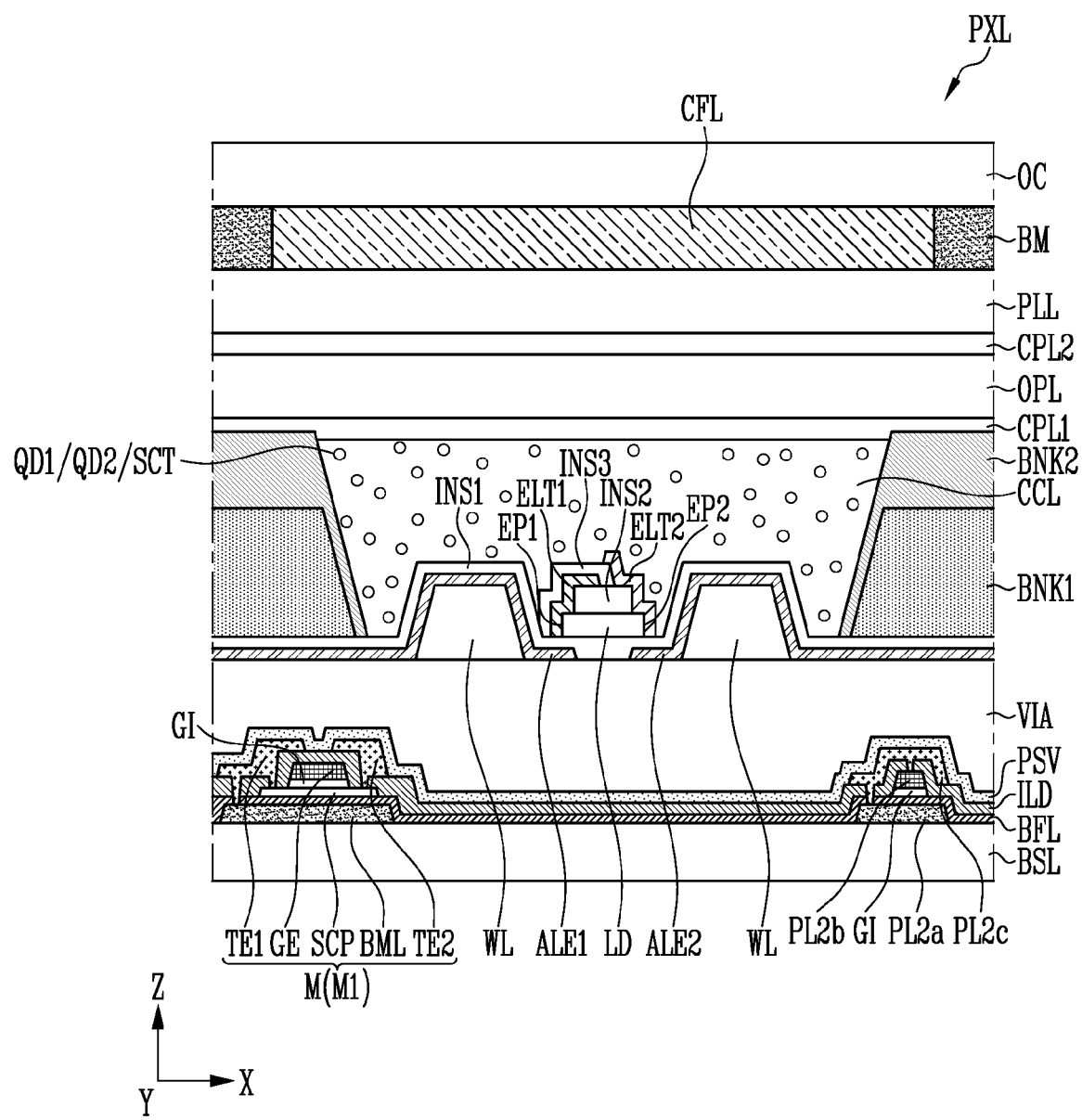
FIG. 12 is a schematic sectional view illustrating a pixel in accordance with an embodiment.
Figure 13:
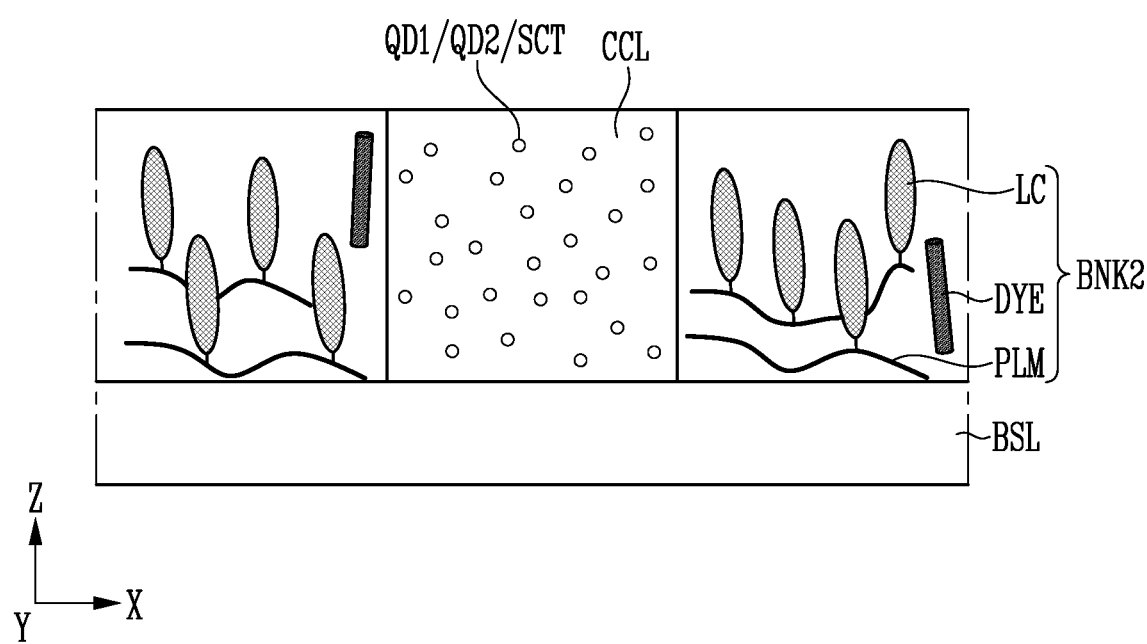
FIG. 13 is a schematic sectional view illustrating a second bank in accordance with an embodiment.

FIG. 11 is a schematic sectional view illustrating first to third pixels in accordance with an embodiment. FIG. 12 is a schematic sectional view illustrating a pixel in accordance with an embodiment. FIG. 13 is a schematic sectional view illustrating a second bank in accordance with an embodiment.

FIG. 11 illustrates a color conversion layer CCL, an optical layer OPL, and/or a color filter layer CFL. In FIG. 11, for convenience of description, components except the base layer BSL and the second bank BNK2, which are shown in FIGS. 7 to 10, will be omitted. FIG. 12 illustrates in detail a stacked structure of a pixel PXL in relation to the color conversion layer CCL, the optical layer OPL, and/or the color filter layer CFL. In FIG. 13, for convenience of description, components except the base layer BSL and the second bank BNK2, which are shown in FIG. 12, will be omitted.

Referring to FIGS. 11 to 13, the second bank BNK2 may be disposed between first to third pixels PXL1, PXL2, and PXL3 or at a boundary area of the first to third pixels PXL1, PXL2, and PXL3, and include an opening overlapping each of the first to third pixels PXL1, PXL2, and PXL3. The opening of the second bank BNK2 may provide a space in which the color conversion layer CCL is provided.

The second bank BNK2 may include a polymer PLM and a liquid crystal material LC. In an example, the liquid crystal material LC may be oriented (or arranged) in the polymer PLM. For example, the second bank BNK2 may be formed of polymer network liquid crystals. The polymer PLM may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB).

The liquid crystal material LC may be a nematic liquid crystal, a smectic liquid crystal, and/or a cholesteric liquid crystal. In an example, the liquid crystal material LC may be formed of a calamitic mesogenic group which exhibit a nematic liquid crystal phase, but embodiments are not limited thereto.

In an embodiment, a difference between an extraordinary refractive index $n_e$ and an ordinary refractive index $n_o$ of the liquid crystal material LC may be about 0.2 or more. The ordinary refractive index $n_o$ of the liquid crystal material LC means a refractive index corresponding to an ordinary axis (or ordinary ray), and the extraordinary refractive index $n_e$ of the liquid crystal material LC means a refractive index corresponding to an extraordinary axis (or extraordinary ray). For example, the liquid crystal material LC may be a birefringent material, and may have double refraction. In case that a beam of light is incident on the liquid crystal material LC, the beam of light may be divided into the ordinary ray and the extraordinary ray. For example, the refractive index of the ordinary ray may be constant (e.g., the ordinary refractive index $n_o$) regardless of the direction of propagation of the incident light in the liquid crystal material LC, and the refractive index of the extraordinary ray may vary (e.g., the extraordinary refractive index $n_e$) according to the direction of propagation of the incident light in the liquid crystal material LC.

In an example, the extraordinary refractive index $n_e$ of the liquid crystal material LC may be about 1.81, and the ordinary refractive index $n_o$ of the liquid crystal material LC may be about 1.53. However, embodiments are not limited thereto.

The extraordinary refractive index $n_e$ of the liquid crystal material LC and a refractive index of the polymer PLM may be different from each other. For example, the liquid crystal material LC may be a birefringent material, but the polymer PLM may not be a birefringent material. The extraordinary refractive index $n_e$ of the liquid crystal material LC may be greater than the refractive index of the polymer PLM. In an example, the extraordinary refractive index $n_e$ of the liquid crystal material LC may be about 1.81, and the refractive index of the polymer PLM may be about 1.55. However, embodiments are not limited thereto. As described above, in case that the extraordinary refractive index $n_e$ of the liquid crystal material LC and the refractive index of the polymer PLM are different from each other, light incident onto a side surface of the second bank BNK2 may be recycled due to a refractive index difference, and thus the efficiency of the color conversion layer CCL may be improved.

For example, the ordinary refractive index $n_o$ of the liquid crystal material LC and the refractive index of the polymer PLM may be substantially equal to each other. As described above, in case that the ordinary refractive index $n_o$ of the liquid crystal material LC and the refractive index of the polymer PLM are substantially equal to each other, scattering of vertically incident light (or light emitted or transmitted in the third direction (e.g., Z-axis direction) may be minimized. Accordingly, in a process of etching the second bank BNK2, a defect of mask alignment key recognition may be prevented, and an undercut phenomenon of the second bank BNK2 may be minimized. The refractive indices of the liquid crystal material LC and the polymer PLM are not limited to the above-described example, and may be variously changed within a range in which a scattering effect according to the direction of incident light may be controlled by using refractive index anisotropy of the liquid crystal material LC.

In some embodiments, the second bank BNK2 may include a color developing member DYE. The color developing member DYE may be provided with being dispersed in the polymer PLM. In an example, the color developing member DYE may be randomly oriented in the polymer PLM to have isotropy. In another example, in order to improve the anisotropic optical density of the second bank BNK2, the color developing member DYE may be self-aligned in the polymer PLM in a direction parallel to an orientation direction of the liquid crystal material LC, but embodiments are not limited thereto.

As described above, in case that the second bank BNK2 includes the color developing member DYE, a defect of color mixture between the first to third pixels PXL1, PXL2, and PXL3. In an example, the color developing member DYE may be formed of various light blocking materials.

The color conversion layer CCL may be disposed above light emitting elements LD in the opening of the second bank BNK2. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first to third pixels PXL1, PXL2, and PXL3 may include light emitting elements LD emitting light of the same color. For example, the first to third pixels PXL1, PXL2, and PXL3 may include light emitting elements LD emitting light of a third color (or blue). The color conversion layer CCL including color conversion particles may be disposed on each of the first to third pixels PXL1, PXL2, and PXL3, so that a full-color image may be displayed.

The first color conversion layer CCL1 may include first color conversion particles for converting light of the third color, which is emitted from the light emitting element LD, into light of a first color. For example, the first color conversion layer CCL1 may include first quantum dots QD1 dispersed in a specific matrix material such as base resin.

In an embodiment, in case that the light emitting element LD is a blue light emitting element emitting light of blue, and the first pixel PXL1 is a red pixel, the first color conversion layer CCL1 may include a first quantum dot QD1 for converting light of blue, which is emitted from the blue light emitting element, into light of red. The first quantum dot QD1 may absorb blue light and emit red light by shifting a wavelength of the blue light according to energy transition. In case that the first pixel PXL1 is a pixel of another color, the first color conversion layer CCL1 may include a first quantum dot QD1 corresponding to the color of the first pixel PXL1.

The second color conversion layer CCL2 may include second color conversion particles for converting light of the third color, which is emitted from the light emitting element LD, into light of a second color. For example, the second color conversion layer CCL2 may include second quantum dots QD2 dispersed in a specific matrix material such as base resin.

In an embodiment, in case that the light emitting element LD is a blue light emitting element emitting light of blue, and the second pixel PXL2 is a green pixel, the second color conversion layer CCL2 may include a second quantum dot QD2 for converting light of blue, which is emitted from the blue light emitting element, into light of green. The second quantum dot QD2 may absorb blue light and emit green light by shifting a wavelength of the blue light according to energy transition. In case that the second pixel PXL2 is a pixel of another color, the second color conversion layer CCL2 may include a second quantum dot QD2 corresponding to the color of the second pixel PXL2.

In an embodiment, light of blue having a relatively short wavelength in a visible light band may be incident into the first quantum dot QD1 and the second quantum dot QD2, so that absorption coefficients of the first quantum dot QD1 and the second quantum dot QD2 may be increased. Accordingly, the efficiency of light finally emitted from the first pixel PXL1 and the second pixel PXL2 may be improved, and excellent color reproduction may be ensured. For example, the light emitting unit EMU of each of the first to third pixels PXL1, PXL2, and PXL3 may be formed by using light emitting elements of the same color (e.g., blue light emitting elements), so that the manufacturing efficiency of the display device may be improved.

The light scattering layer LSL may be formed to efficiently use light of the third color (or blue) emitted from the light emitting element LD. In an example, in case that the light emitting element LD is a blue light emitting element emitting light of blue, and the third pixel PXL3 is a blue pixel, the light scattering layer LSL may include at least one kind of light scattering particle SCT to efficiently use light emitted from the light emitting element LD. In an example, the light scattering particle SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The light scattering particle SCT may not be disposed only in the third pixel PXL3, and may be selectively included in the first color conversion layer CCL1 or the second color conversion layer CCL2. In some embodiments, the light scattering particle SCT may be omitted such that the light scattering layer LSL formed of transparent polymer may be formed.

A first capping layer CPL1 may be disposed on the color conversion layer CCL. The first capping layer CPL1 may be disposed through the first to third pixels PXL1, PXL2, and PXL3. The first capping layer CPL1 may cover the color conversion layer CCL. The first capping layer CPL1 may prevent the color conversion layer CCL from being damaged or contaminated due to infiltration of an impurity such as moisture or air from the outside.

The first capping layer CPL1 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like.

The optical layer OPL may be disposed on the first capping layer CPL. The optical layer OPL may function to improve light extraction efficiency by recycling light transmitted from the color conversion layer CCL through total reflection. For example, the optical layer OPL may have a refractive index relatively lower than a refractive index of the color conversion layer CCL. For example, the refractive index of the color conversion layer may be about 1.6 to about 2.0, and the refractive index of the optical layer OPL may be about 1.1 to about 1.3.

A second capping layer CPL2 may be disposed on the optical layer OPL. The second capping layer CPL2 may be disposed throughout the first to third pixels PXL1, PXL2, and PXL3. The second capping layer CPL2 may cover the optical layer OPL. The second capping layer CPL2 may prevent the optical layer OPL from being damaged or contaminated due to infiltration of an impurity such as moisture or air from the outside.

The second capping layer CPL2 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like.

A planarization layer PLL may be disposed on the second capping layer CPL2. The planarization layer PLL may be disposed throughout the first to third pixels PXL1, PXL2, and PXL3.

The planarization layer PLL may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, embodiments are not limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer PLL. The color filter layer CFL may include color filters CF1, CF2, and CF3 which accord with (or correspond to) a color of each pixel PXL. The color filters CF1, CF2, and CF3 which accord with (or correspond to) a color of each of the first to third pixels PXL1, PXL2, and PXL3 are disposed, so that a full-color image may be displayed.

The color filter layer CFL may include a first color filter CF1 disposed in the first pixel PXL1 to selectively transmit light emitted from the first pixel PXL1 therethrough, a second color filter CF2 disposed in the second pixel PXL2 to selectively transmit light emitted from the second pixel PXL2 therethrough, and a third color filter CF3 disposed in the third pixel PXL3 to selectively transmit light emitted from the third pixel PXL3 therethrough.

In an embodiment, the first color filter CF1, the second color filter CF2, and the third color filter CF3 may be respectively a red color filter, a green color filter, and a blue color filter, but embodiments are not limited thereto. Hereinafter, in case that an arbitrary color filter among the first color filter CF1, the second color filter CF2, and the third color filter CF3 is designated (or mentioned) or in case that two or more kinds of color filters are inclusively designated (or mentioned), the corresponding color filter or the corresponding color filters are referred to as a "color filter CF" or "color filters CF."

The first color filter CF1 may overlap the first color conversion layer CCL1 of the first pixel PXL1 in the third direction (e.g., Z-axis direction). The first color filter CF1 may include a color filter material for selectively transmitting light of a first color (or red) therethrough. For example, in case that the first pixel PXL1 is a red pixel, the first color filter CF1 may include a red color filter material.

The second color filter CF2 may overlap the second color conversion layer CCL2 of the second pixel PXL2 in the third direction (e.g., Z-axis direction). The second color filter CF2 may include a color filter material for selectively transmitting light of a second color (or green) therethrough. For example, in case that the second pixel PXL2 is a green pixel, the second color filter CF2 may include a green color filter material.

The third color filter CF3 may overlap the light scattering layer LSL of the third pixel PXL3 in the third direction (e.g., Z-axis direction). The third color filter CF3 may include a color filter material for selectively transmitting light of a third color (or blue) therethrough. For example, in case that the third pixel PXL3 is a blue pixel, the third color filter CF3 may include a blue color filter material.

In some embodiments, a light blocking layer BM may be further disposed between the first to third color filters CF1, CF2, and CF3. As described above, in case that the light blocking layer BM is formed between the first to third color filters CF1, CF2, and CF3, a color mixture defect viewed at the front or side of the display device may be prevented. The material of the light blocking layer BM is not limited thereto, and the light blocking layer BM may be formed of various light blocking materials. In an example, the light blocking layer BM may be implemented by stacking the first to third color filters CF1, CF2, and CF3.

An overcoat layer OC may be disposed on the color filter layer CFL. The overcoat layer OC may be disposed throughout the first to third pixels PXL1, PXL2, and PXL3. The overcoat layer OC may cover a lower member including the color filter layer CFL. The overcoat layer OC may prevent moisture or air from infiltrating (or permeating) into the above-described lower member. Also, the overcoat layer OC may protect the above-described lower member from a foreign matter such as dust.

The overcoat layer OC may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, embodiments are not limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In accordance with the above-described embodiment, the efficiency of the color conversion layer CCL may be improved by using the refractive index anisotropy of the liquid crystal material LC, and simultaneously, the scattering of vertical incident light may be minimized. Thus, the defect of mask alignment key recognition may be prevented, and the undercut phenomenon of the second bank BNK2 may be minimized.

A method of manufacturing the above-described display device in accordance with an embodiment.

FIGS. 14 to 20 are schematic sectional views illustrating a method of manufacturing the display device in accordance with an embodiment. FIGS. 14 to 20 are schematic sectional views illustrating a method of manufacturing the display device shown in FIGS. 12 and 13. In FIGS. 14 to 20, components substantially identical to those shown in FIGS. 12 and 13 are designated (or mentioned) by like reference numerals, and their detailed descriptions will be omitted.

Figure 14:
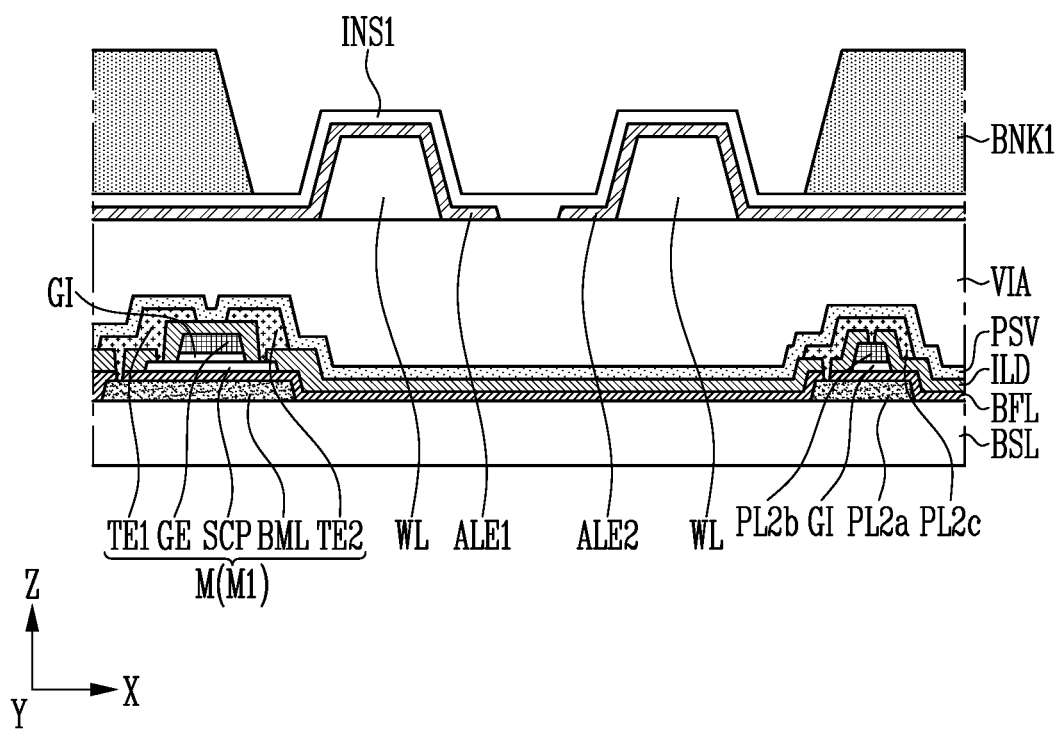
FIGS. 14 to 20 are schematic sectional views illustrating a method of manufacturing the display device in accordance with an embodiment.

Referring to FIG. 14, electrodes ALE (e.g., alignment electrodes), a first insulating layer INS1, and/or a first bank BNK1 may be formed on a base layer BSL on which circuit elements including a transistor M are formed.

Figure 15:
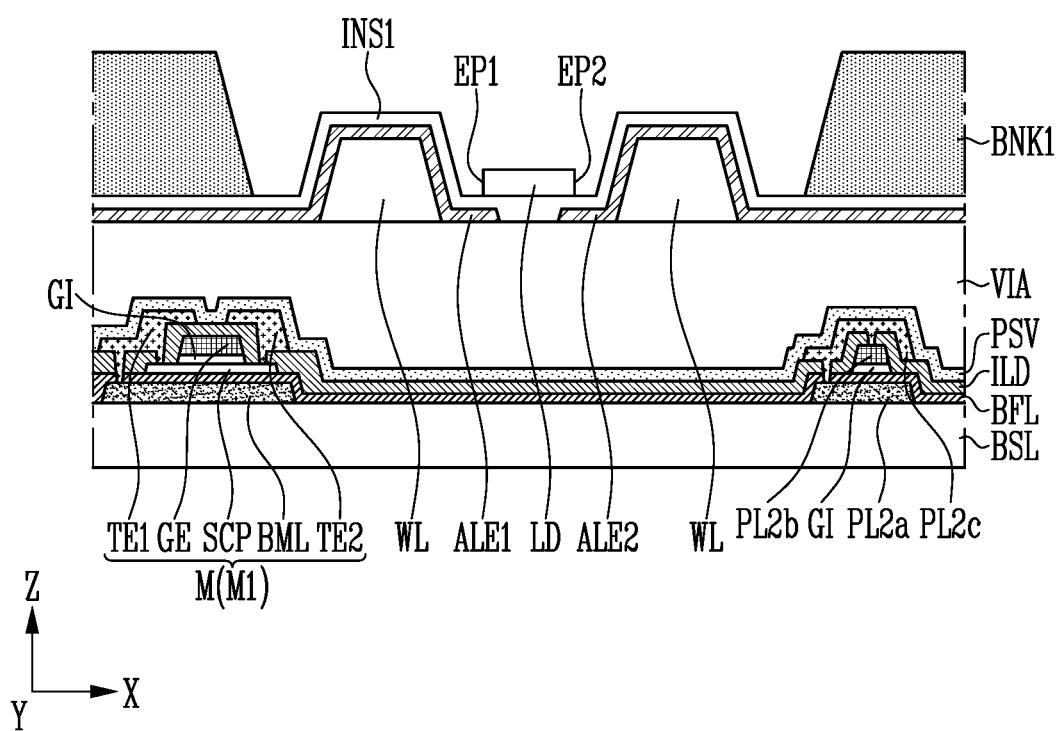

Referring to FIG. 15, light emitting elements LD may be disposed between the electrodes ALE. The light emitting elements LD may be disposed between wall layers WL on the first insulating layer INS1 and may be arranged between the electrodes ALE. The light emitting elements LD may be prepared in a form in which the light emitting elements LD are dispersed in a light emitting element ink and may be supplied through an inkjet printing process, or the like. In an example, the light emitting elements LD may be disposed with being dispersed in a volatile solvent. In case that an alignment voltage is supplied to the electrodes ALE, an electric field may be formed between the electrodes ALE, so that the light emitting elements LD may be aligned between the electrodes ALE. After the light emitting elements LD are aligned, the solvent may be volatilized or removed by other processes, so that the light emitting elements LD may be stably arranged between the electrodes ALE.

Figure 16:
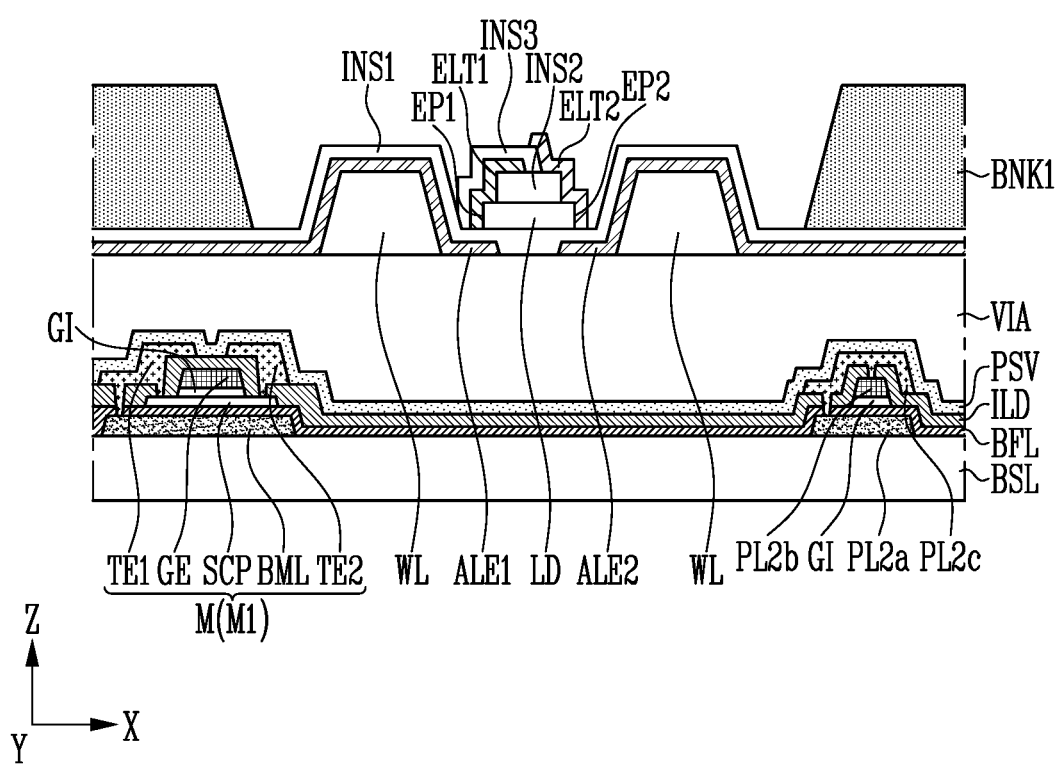

Referring to FIG. 16, a second insulating layer INS2 and/or connection electrodes ELT may be formed on the light emitting elements LD. The second insulating layer INS2 may be formed (e.g., partially formed) on the top of the light emitting elements LD, and expose first and second end portions EP1 and EP2 of the light emitting elements LD. In case that the second insulating layer INS2 is formed on the light emitting elements LD after the light emitting elements LD are completely aligned, the light emitting elements LD may be prevented from being separated from positions at which the light emitting elements LD are aligned.

For example, the connection electrodes ELT may be formed on the first and second end portions EP1 and EP2 of the light emitting elements LD, which are exposed by the second insulating layer INS2. A first connection electrode ELT1 may be formed on the first end portions EP1 of the light emitting elements LD to be in contact with the first end portions EP1 of the light emitting elements LD. A second connection electrode ELT2 may be formed on the second end portions EP2 of the light emitting elements LD to be in contact with the second end portions EP2 of the light emitting elements LD.

Figure 17:
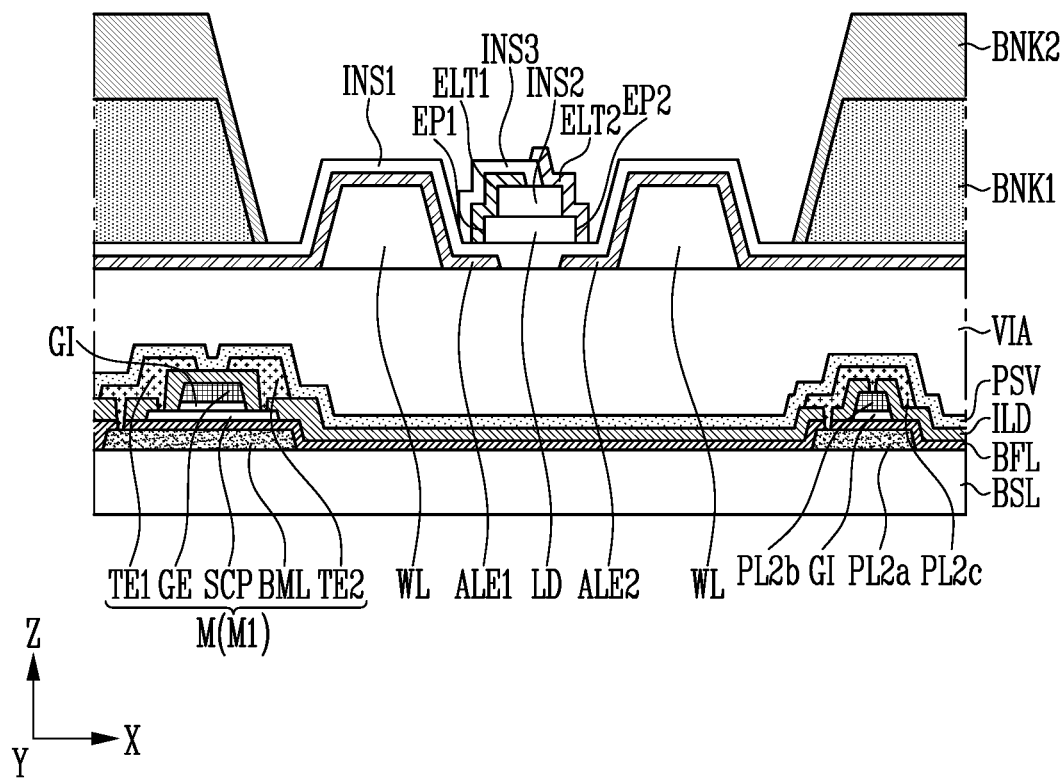
Figure 18:
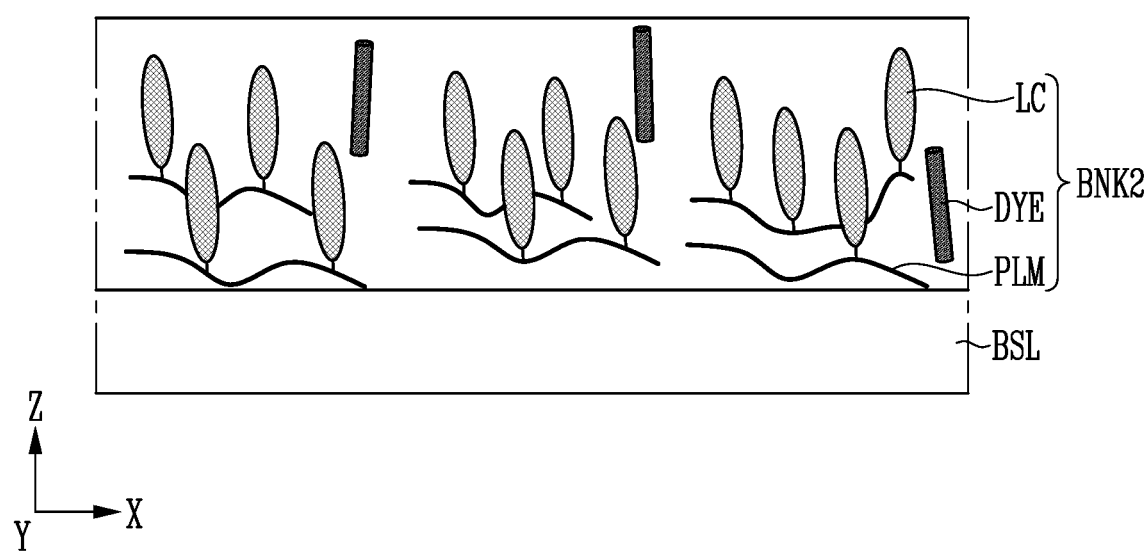

Referring to FIG. 17, a second bank BNK2 may be formed. A process of forming the second bank BNK2 will be described in detail with reference to FIGS. 18 and 19. Referring to FIG. 18, the second bank BNK2 may be formed by coating a bank material layer on the base layer BSL and curing the bank material layer. The bank material layer may include a liquid crystal material LC, a color developing member DYE, a monomer, a binder, and/or a photoinitiator, but embodiments are not limited thereto. For example, a polymer PLM may be formed of the monomer, the binder, and/or the photoinitiator by curing the bank material layer. The liquid crystal material LC may be oriented (or arranged) in the polymer PLM of the second bank BNK2 in the process of curing the bank material layer, e.g., in the Z-axis direction.

Figure 19:
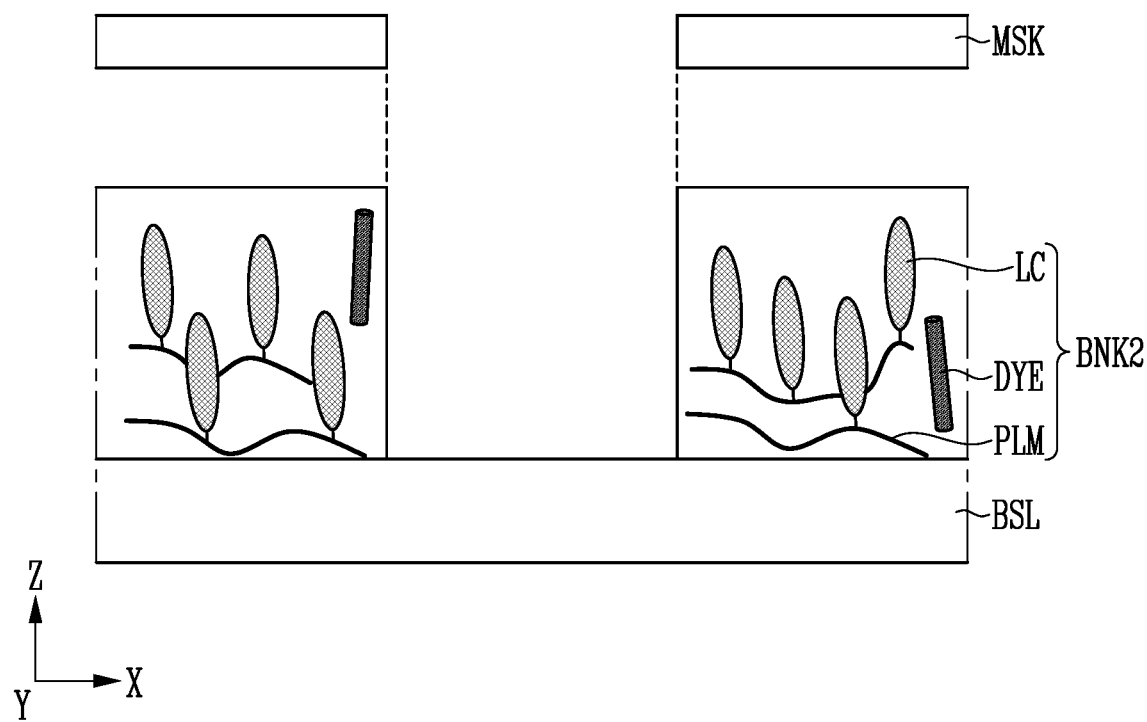

Referring to FIG. 19, an opening may be formed by etching the second bank BNK2. As described above, an ordinary refractive index $n_o$ and a refractive index of the polymer PLM may be substantially equal to each other. In case that the ordinary refractive index $n_o$ and the refractive index of the polymer PLM are substantially equal to each other, scattering of vertically incident light (or light emitted in the third direction, e.g., Z-axis direction) may be minimized. For example, scattering of a probe beam may be minimized in a process of aligning a mask MSK, and thus a defect of mask alignment key recognition may be minimized. For example, an undercut phenomenon caused by scattering in an exposure process may be minimized, and thus the opening of the second bank BNK2 may be stably formed, which has been described above.

Figure 20:
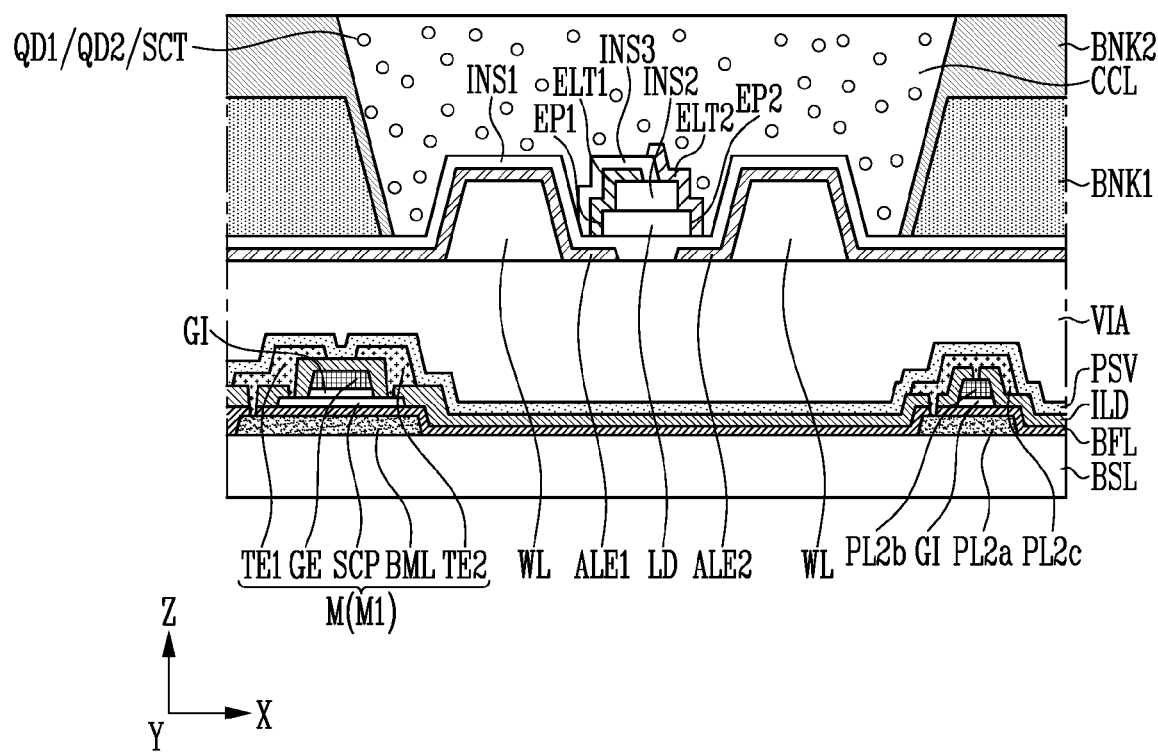

Referring to FIG. 20, a color conversion layer CCL may be formed in the opening of the second bank BNK2. As described above, an extraordinary refractive index $n_e$ of the liquid crystal material LC and the refractive index of the polymer PLM may be different from each other. In an example, the extraordinary refractive index $n_e$ of the liquid crystal material LC may be greater than the refractive index of the polymer PLM. As described above, in case that the extraordinary refractive index $n_e$ of the liquid crystal material LC and the refractive index of the polymer PLM are different from each other, light incident to the color conversion layer CCL may be recycled due to a refractive index difference, and thus the light emission efficiency of the display panel PNL may be improved, which has been described above. In an embodiment, a difference between the extraordinary refractive index $n_e$ of the liquid crystal material LC and the refractive index of the polymer PLM may be about 2.0 or more, but embodiments are not limited thereto.

For example, a first capping layer CPL1, an optical layer OPL, a second capping layer CPL2, a planarization layer PPL, a color filter layer CFL, and/or an overcoat layer OC may be formed on the color conversion layer CCL, thereby completing the display device shown in FIGS. 12 and 13.

In accordance with the disclosure, the efficiency of a color conversion layer may be improved by using refractive index anisotropy of a liquid crystal material, and simultaneously, scattering of vertically incident light may be minimized. Thus, a defect of mask alignment key recognition may be prevented, and an undercut phenomenon of a bank may be minimized.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
   electrodes disposed in pixels, the electrodes being spaced apart from each other;
   light emitting elements disposed between the electrodes;
   a bank including opening overlapping the light emitting elements; and
   a color conversion layer disposed in the opening, wherein the bank includes a polymer and a liquid crystal material.

2. The display device of claim 1, wherein a refractive index of the polymer and an ordinary refractive index of the liquid crystal material are substantially equal to each other.

3. The display device of claim 1, wherein a refractive index of the polymer and an extraordinary refractive index of the liquid crystal material are different from each other.

4. The display device of claim 1, wherein a difference between an extraordinary refractive index and an ordinary refractive index of the liquid crystal material is about 0.2 or more.

5. The display device of claim 1, wherein the bank further includes a color developing member dispersed in the polymer.

6. The display device of claim 5, wherein an orientation direction of the color developing member in the polymer and an orientation direction of the liquid crystal material are substantially same as each other.

7. The display device of claim 1, wherein
   the pixels include a first pixel, a second pixel, and a third pixel, and
   the bank is disposed at a boundary area of the first pixel, the second pixel, and the third pixel.

8. The display device of claim 7, wherein the color conversion layer includes:
a first color conversion layer overlapping the first pixel;
a second color conversion layer overlapping the second pixel; and
a light scattering layer overlapping the third pixel.

9. The display device of claim 8, further comprising a color filter layer disposed above the color conversion layer.

10. The display device of claim 9, wherein the color filter layer includes:
a first color filter layer disposed above the first color conversion layer;
a second color filter layer disposed above the second color conversion layer; and
a third color filter layer disposed above the light scattering layer.

11. The display device of claim 1, further comprising connection electrodes disposed on the light emitting elements.

12. The display device of claim 1, wherein each of the light emitting elements includes a first semiconductor layer, a second semiconductor layer disposed on the first semiconductor layer, and an active layer disposed between the first semiconductor layer and the second semiconductor layer.

13. A method of manufacturing a display device, the method comprising:
providing light emitting elements on a substrate;
forming, on the light emitting elements, a bank including a polymer and a liquid crystal material;
forming an opening by etching the bank; and
forming a color conversion layer in the opening.

14. The method of claim 13, wherein the forming of the bank includes:
forming a bank material layer including the liquid crystal material, a monomer, and a binder; and
curing the bank material layer.

15. The method of claim 14, wherein the bank material layer further includes a color developing member.

16. The method of claim 13, wherein a refractive index of the polymer and an ordinary refractive index of the liquid crystal material are substantially equal to each other.

17. The method of claim 13, wherein a refractive index of the polymer and an extraordinary refractive index of the liquid crystal material are different from each other.

18. The method of claim 13, wherein a difference between an extraordinary refractive index and an ordinary refractive index of the liquid crystal material is about 0.2 or more.

19. The method of claim 13, further comprising forming electrodes spaced apart from each other on the substrate.

20. The method of claim 19, further comprising aligning the light emitting elements between the electrodes.

* * * * *